(12) United States Patent
Alam et al.

(10) Patent No.: US 8,536,059 B2
(45) Date of Patent: Sep. 17, 2013

(54) EQUIPMENT AND METHODS FOR ETCHING OF MEMS

(75) Inventors: Khurshid Syed Alam, Mountain View, CA (US); Evgeni Gousev, Saratoga, CA (US); Marc Maurice Mignard, San Jose, CA (US); David Heald, Solvang, CA (US); Ana R. Londergan, Santa Clara, CA (US); Philip Don Floyd, Redwood City, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 538 days.

(21) Appl. No.: 12/527,864

(22) PCT Filed: Feb. 18, 2008

(86) PCT No.: PCT/US2008/054222
§ 371 (c)(1), (2), (4) Date: Mar. 4, 2010

(87) PCT Pub. No.: WO2008/103632
PCT Pub. Date: Aug. 28, 2008

(65) Prior Publication Data
US 2010/0219155 A1    Sep. 2, 2010

Related U.S. Application Data

(60) Provisional application No. 60/890,824, filed on Feb. 20, 2007.

(51) Int. Cl.
*H01L 21/302* (2006.01)
*H01L 21/461* (2006.01)

(52) U.S. Cl.
USPC .......... 438/706; 438/707; 438/710; 438/711; 438/712; 438/714; 438/723; 438/724

(58) Field of Classification Search
None
See application file for complete search history.

(56) References Cited

U.S. PATENT DOCUMENTS

| 2,534,846 A | 12/1950 | Ambrose et al. |
| 3,439,973 A | 4/1969 | Paul et al. |

(Continued)

FOREIGN PATENT DOCUMENTS

| DE | 10 2005 029803 | 1/2007 |
| EP | 0 008 347 | 3/1980 |

(Continued)

OTHER PUBLICATIONS

Biasotto et al., Silicon Oxide Sacrificial Layer for MEMS Applications, Microelectronics Technology and Devices Conference Proceedings (Electrochemical Society), 2005, pp. 389-397.

(Continued)

*Primary Examiner* — Duy Deo
(74) *Attorney, Agent, or Firm* — Knobbe Martens Olson & Bear LLP

(57) ABSTRACT

Etching equipment and methods are disclosed herein for more efficient etching of sacrificial material from between permanent MEMS structures. An etching head includes an elongate etchant inlet structure, which may be slot-shaped or an elongate distribution of inlet holes. A substrate is supported in proximity to the etching head in a manner that defines a flow path substantially parallel to the substrate face, and permits relative motion for the etching head to scan across the substrate.

21 Claims, 18 Drawing Sheets

(56) References Cited

U.S. PATENT DOCUMENTS

| | | |
|---|---|---|
| 3,443,854 A | 5/1969 | Weiss |
| 3,701,586 A | 10/1972 | Goetz |
| 3,955,190 A | 5/1976 | Teraishi |
| 4,407,695 A | 10/1983 | Deckman et al. |
| 4,425,572 A | 1/1984 | Takafuji et al. |
| 4,551,197 A | 11/1985 | Guilmette et al. |
| 4,617,608 A | 10/1986 | Blonder et al. |
| 4,790,634 A | 12/1988 | Miller et al. |
| 4,852,516 A | 8/1989 | Rubin et al. |
| 4,923,283 A | 5/1990 | Verhulst et al. |
| 5,002,631 A | 3/1991 | Giapis et al. |
| 5,083,364 A | 1/1992 | Olbrich et al. |
| 5,114,226 A | 5/1992 | Goodwin et al. |
| 5,170,283 A | 12/1992 | O'Brien et al. |
| 5,259,923 A | 11/1993 | Hori et al. |
| 5,334,250 A | 8/1994 | Mikami et al. |
| 5,337,191 A | 8/1994 | Austin |
| 5,374,346 A | 12/1994 | Bladon et al. |
| 5,439,763 A | 8/1995 | Shimase et al. |
| 5,454,904 A | 10/1995 | Ghezzo et al. |
| 5,500,761 A | 3/1996 | Goossen et al. |
| 5,536,359 A | 7/1996 | Kawada et al. |
| 5,773,088 A | 6/1998 | Bhat |
| 5,785,877 A | 7/1998 | Sato et al. |
| 5,795,208 A | 8/1998 | Hattori |
| 5,824,374 A | 10/1998 | Bradley, Jr. et al. |
| 5,835,255 A | 11/1998 | Miles |
| 5,844,711 A | 12/1998 | Long, Jr. |
| 5,882,468 A | 3/1999 | Crockett et al. |
| 5,906,536 A | 5/1999 | Imazato et al. |
| 5,914,804 A | 6/1999 | Goossen et al. |
| 5,919,548 A | 7/1999 | Barron et al. |
| 5,940,684 A | 8/1999 | Shakuda et al. |
| 5,949,571 A | 9/1999 | Goossen et al. |
| 6,020,047 A | 2/2000 | Everhart |
| 6,033,919 A | 3/2000 | Gnade et al. |
| 6,040,937 A | 3/2000 | Miles |
| 6,136,213 A * | 10/2000 | Shinozuka et al. ............. 216/58 |
| 6,142,358 A | 11/2000 | Cohn et al. |
| 6,170,332 B1 | 1/2001 | MacDonald et al. |
| 6,218,056 B1 | 4/2001 | Pinarbasi et al. |
| 6,335,224 B1 | 1/2002 | Peterson |
| 6,351,577 B1 | 2/2002 | Aksyuk et al. |
| 6,379,988 B1 | 4/2002 | Peterson et al. |
| 6,384,952 B1 | 5/2002 | Clark et al. |
| 6,409,876 B1 | 6/2002 | McQuarrie et al. |
| 6,511,917 B2 | 1/2003 | Haji et al. |
| 6,535,318 B1 | 3/2003 | Wood et al. |
| 6,558,506 B1 | 5/2003 | Freeman et al. |
| 6,650,455 B2 | 11/2003 | Miles |
| 6,661,069 B1 | 12/2003 | Chinthakindi et al. |
| 6,662,950 B1 | 12/2003 | Cleaver |
| 6,674,562 B1 | 1/2004 | Miles |
| 6,696,096 B2 | 2/2004 | Tsubaki et al. |
| 6,713,235 B1 | 3/2004 | Ide et al. |
| 6,736,987 B1 | 5/2004 | Cho |
| 6,780,491 B1 | 8/2004 | Cathey et al. |
| 6,808,953 B2 | 10/2004 | Partridge et al. |
| 6,822,304 B1 | 11/2004 | Honer |
| 6,919,274 B2 | 7/2005 | Kazumi et al. |
| 6,931,935 B2 | 8/2005 | Blomberg |
| 6,943,448 B2 | 9/2005 | Gabriel et al. |
| 6,947,195 B2 | 9/2005 | Ohtaka et al. |
| 6,949,202 B1 | 9/2005 | Patel et al. |
| 6,967,986 B2 | 11/2005 | Kowarz et al. |
| 7,050,219 B2 | 5/2006 | Kimura |
| 7,064,089 B2 | 6/2006 | Yamazaki et al. |
| 7,082,684 B2 | 8/2006 | Hantschel et al. |
| 7,113,339 B2 | 9/2006 | Taguchi et al. |
| 7,123,216 B1 | 10/2006 | Miles |
| 7,145,143 B2 | 12/2006 | Wood et al. |
| 7,190,245 B2 | 3/2007 | Receveur et al. |
| 7,195,343 B2 | 3/2007 | Anderson et al. |
| 7,221,495 B2 | 5/2007 | Miles et al. |
| 7,245,285 B2 | 7/2007 | Yeh et al. |
| 7,252,861 B2 | 8/2007 | Smalley |
| 7,297,471 B1 | 11/2007 | Miles |
| 7,327,510 B2 | 2/2008 | Cummings et al. |
| 7,329,917 B2 | 2/2008 | Patraw et al. |
| 7,382,515 B2 | 6/2008 | Chung et al. |
| 7,399,710 B2 | 7/2008 | Launay |
| 7,432,201 B2 | 10/2008 | Takehara et al. |
| 7,534,640 B2 | 5/2009 | Sasagawa et al. |
| 7,569,488 B2 | 8/2009 | Rafanan |
| 2002/0033229 A1 | 3/2002 | Lebouitz et al. |
| 2002/0045362 A1 | 4/2002 | Tsubaki et al. |
| 2002/0150130 A1 | 10/2002 | Coldren et al. |
| 2002/0162569 A1 | 11/2002 | Kuo et al. |
| 2002/0197761 A1 * | 12/2002 | Patel et al. ............. 438/52 |
| 2003/0012866 A1 | 1/2003 | Harnett et al. |
| 2003/0104752 A1 | 6/2003 | Lee et al. |
| 2003/0121609 A1 | 7/2003 | Ohmi et al. |
| 2003/0123125 A1 | 7/2003 | Little |
| 2004/0000489 A1 | 1/2004 | Zhang et al. |
| 2004/0012298 A1 | 1/2004 | Cunningham et al. |
| 2004/0028849 A1 | 2/2004 | Stark et al. |
| 2004/0029026 A1 | 2/2004 | Hayasaki et al. |
| 2004/0188785 A1 | 9/2004 | Cunningham et al. |
| 2004/0226909 A1 | 11/2004 | Tzeng |
| 2005/0001274 A1 | 1/2005 | Kim et al. |
| 2005/0068627 A1 | 3/2005 | Nakamura et al. |
| 2005/0124135 A1 | 6/2005 | Ayazi et al. |
| 2005/0146401 A1 | 7/2005 | Tilmans et al. |
| 2005/0206993 A1 | 9/2005 | Doan et al. |
| 2005/0231787 A1 | 10/2005 | Tsuboi et al. |
| 2006/0008200 A1 | 1/2006 | Nakamura et al. |
| 2006/0016784 A1 | 1/2006 | Voss |
| 2006/0065622 A1 * | 3/2006 | Floyd et al. ............. 216/58 |
| 2006/0067650 A1 | 3/2006 | Chui |
| 2006/0067651 A1 | 3/2006 | Chui |
| 2006/0077526 A1 | 4/2006 | Yun |
| 2006/0077527 A1 | 4/2006 | Cummings |
| 2006/0082863 A1 | 4/2006 | Piehl et al. |
| 2006/0096705 A1 | 5/2006 | Shi et al. |
| 2006/0148262 A1 | 7/2006 | Lee et al. |
| 2006/0170012 A1 | 8/2006 | Larmer et al. |
| 2006/0183644 A1 | 8/2006 | Nakamura et al. |
| 2006/0186759 A1 | 8/2006 | Kim et al. |
| 2006/0266730 A1 | 11/2006 | Doan et al. |
| 2007/0018761 A1 | 1/2007 | Yamanaka et al. |
| 2007/0020794 A1 | 1/2007 | DeBar |
| 2007/0026636 A1 | 2/2007 | Gogoi |
| 2007/0042521 A1 | 2/2007 | Yama |
| 2007/0077525 A1 | 4/2007 | Davis et al. |
| 2008/0057182 A1 | 3/2008 | Boyd et al. |
| 2008/0157413 A1 | 7/2008 | Lin |
| 2008/0158635 A1 | 7/2008 | Hagood et al. |
| 2008/0165122 A1 | 7/2008 | Duthaler et al. |
| 2008/0217645 A1 | 9/2008 | Saxler et al. |
| 2008/0283180 A1 | 11/2008 | Bachman et al. |
| 2008/0311690 A1 | 12/2008 | Tu et al. |
| 2009/0086306 A1 | 4/2009 | Kothari et al. |
| 2009/0218312 A1 | 9/2009 | Floyd et al. |

FOREIGN PATENT DOCUMENTS

| | | |
|---|---|---|
| EP | 0 578 228 | 1/1994 |
| EP | 0 747 684 | 12/1996 |
| EP | 0 878 824 | 11/1998 |
| EP | 1 190 759 | 3/2002 |
| EP | 1 493 711 | 1/2005 |
| EP | 1 641 026 | 3/2006 |
| JP | 63-194285 | 8/1988 |
| JP | 03-087025 | 4/1991 |
| JP | 5-196881 | 8/1993 |
| JP | 5-281479 | 10/1993 |
| JP | 06-188305 | 7/1994 |
| JP | 07-161688 | 6/1995 |
| JP | 08-323699 | 12/1996 |
| JP | 09-33942 | 7/1997 |
| JP | 10-064887 | 3/1998 |
| JP | 10-209176 | 8/1998 |
| JP | 11-160635 | 6/1999 |
| JP | 2000-28938 | 1/2000 |
| JP | 2000-294535 | 10/2000 |

| | | |
|---|---|---|
| JP | 2001-272613 | 10/2001 |
| JP | 2002-344111 | 11/2002 |
| JP | 2003-136499 | 5/2003 |
| JP | 2004-137519 | 5/2004 |
| JP | 2004518271 A | 6/2004 |
| JP | 2005 211997 | 8/2005 |
| JP | 2006-156127 | 6/2006 |
| JP | 2006-261284 | 9/2006 |
| WO | WO 02/19391 | 3/2002 |
| WO | WO 2004/041918 | 5/2004 |
| WO | WO 2004/075231 | 9/2004 |
| WO | WO 2005/057291 | 6/2005 |
| WO | WO 2005/110915 | 11/2005 |
| WO | WO 2006/110042 | 10/2006 |
| WO | WO 2006/110293 | 10/2006 |
| WO | WO 2008/046682 | 4/2008 |

OTHER PUBLICATIONS

Chui et al., The iMOD display: considerations and challenges in fabricating MOEMS on large area glass substrates, Proceedings of SPIE, Jan. 22, 2007, vol. 6466.

Dowling et al., Selective wet-etching of filtered-arc-deposited TiN films on Cr sacrificial layers, Proceedings of the SPIE—The International Society for Optical Engineering, 2004, vol. 5276, Issue 1, pp. 213-220.

Fang et al., Modeling the effect of etch holes on ferromagnetic MEMS, Magnetics, IEEE Transactions, Jul. 2004, vol. 37, Issue 4, Part 1, pp. 2637-2639.

International Search Report and Written Opinion dated Apr. 16, 2009 for Application No. PCT/US2008/076077.

Invitation to Pay Additional Fees for PCT/US2008/076077, filed Sep. 11, 2009.

Jerman, J.H. et al., Miniature Fabry-Perot Interferometers Micromachined in Silicon For Use in Optical Fiber Wdm Systems, Transducers. San Francisco, Jun. 24-27, 1991, Proceedings of the Internatioal Conference on Solid State Sensors Andactuators, Jun. 24, 1991, vol. Conf. 6, New Youk IEEE, US.

Ko et al., Micromachined air-gap structure MEMS acoustic sensor using reproducible high-speed lateral etching and CMP process, Journal of Micromechanics and Microengineering, IOP Publishing, Oct. 2006, vol. 16, Issue 10, pp. 2071-2076.

Kogut et al., A finite element based elastic-plastic model for the contact of rough surfaces, Tribology Transactions, 2003, vol. 46, Issue 3, pp. 383-390.

Lewis, Richard J., Hawley's Condensed Chemical Dictionary, Thirteenth Edition, 1997, pp. 761.

Livingston, Ian P., Fabrication of an integrated surface microelectromechanical capacitive pressure sensor using an aluminum flexible diaphragm with on-chip electronics, Thesis (M.S.)—Rochester Institute of Technology, 1999 (Abstract).

Miles, A New Reflective FPD Technology Using Interferometric Modulation, Journal of the SID, 5/4, 1997, pp. 379-382.

Miles, MEMS—based interferometric modulator for display applications, Proceedings of SPIE, Aug. 1999, vol. 3876.

Mishima et al., High-performance CMOS circuits fabricated by excimer-laser-annealed poly-si TFT's on glass substrates, IEEE Electron Device Letters, Feb. 2001, vol. 22, Issue 2, pp. 89-91.

Office Action dated Feb. 1, 2010 in U.S. Appl. No. 12/210,138.

Office Action dated Jul. 31, 2009 in U.S. Appl. No. 12/210,138.

Office Action dated Mar. 4, 2009 in U.S. Appl. No. 12/210,138.

Petersen et al., Light-activated micromechanical devices, IBM Technical Disclosure Bulletin, 1978, vol. 21, Issue 3, pp. 1205-1206.

Stahl, H. et al., Thin film encapsulation of acceleration sensors using polysilicon sacrificial layers, http://ieexplore.ieee.org/Xplore/login.jsp?url=/iel5/8626/27359/01217162.pdf, Jun. 2003.

Tabata et al., In situ observation and analysis of wet etching process for micro electro-mechanical systems, Micro Electro Mechanical Systems, IEEE, Jan. 1991, pp. 99-102.

Winters, H.F. et al., The Etching of Silicon with XeF2 Vapor, Appl. Phys. Lett., 1979, vol. 34, Issue 1, pp. 70-73.

Yang et al., Comparative study on chemical stability of dielectric oxide films under HF wet and vapor etching for radiofrequency microelectromechanical system application, Thin Solid Films, Basic Res. Lab., Electron. & Telecommun. Res. Inst., Publisher: Elsevier, Apr. 3, 2006, vol. 500, Issue 1-2, pp. 231-236, Daejeon, South Korea.

Zhu et al., Investigation of fabricating ultra deep and high aspect ratio electrical isolation trench without void, Solid-State and Integrated Circuits Technology, 2004. Proceedings. 7th International Conference, Oct. 2004, vol. 3, pp. 1892-1895.

Chung et al., 2005, Fabrication and characterization of amorphous Si films by PECVD for MEMS, J. Micromech. Microeng. 15:136-142.

Hacker et al., 1997, Properties of new low dielectric constant spin-on silicon oxide based polymers, Mat. Res. Soc. Symp. Proc. 476:25-30.

Kucherenko, 2000, Modelling effects of surface tension on surface topology in spin coatings for integrated optics and micromechanics, J. Micromech Microeng., 10:299-308.

Rusu et al., 2001, Planarization of deep trenches, Proc. SPIE, 4557:49-57.

Brosnihan et al., "Optical IMEMS—A fabrication process for MEMS optical switches with integrated on-chip electronic," Transducers, Solid-State Sensors, Actuators and Microsystems, 12th International Conference 2003, vol. 2, issue, 8-12 pp. 1638-1642, Jun. 2003.

O'Mara, "Chapter Two: Display Manufacturing Process," Liquid Crystal Flat Panel Displays, 1993, pp. 57-111, Chapman & Hall, NY.

Penta Vacuum MEMS Etcher Specifications, HTTP—www.pentavacuum.com-memes.htm, 2002.

Rao et al., Single-mask, three-dimensional microfabrication of high-aspect-ratio structures in bulk silicon using reactive ion etching lag and sacrificial oxidation, Applied Physics Letters 85(25):6281-6283 Dec. 20, 2004.

ISR and WO dated Nov. 17, 2008 for PCT/US08/054222.

IPRP dated Jun. 26, 2009 for PCT/US08/054222.

Office Action dated Dec. 2, 2010 in Chinese App. No. 200880005644.2.

Notice of Reasons for Rejection dated Jan. 24, 2012 in Japanese App. No. 2009-550972.

Notice of Reasons for Rejection dated Oct. 30, 2012 in Japanese App. No. 2009-550972.

* cited by examiner

10 CYCLES

20 CYCLES

*30 CYCLES*

*40 CYCLES*

50 CYCLES

60 CYCLES

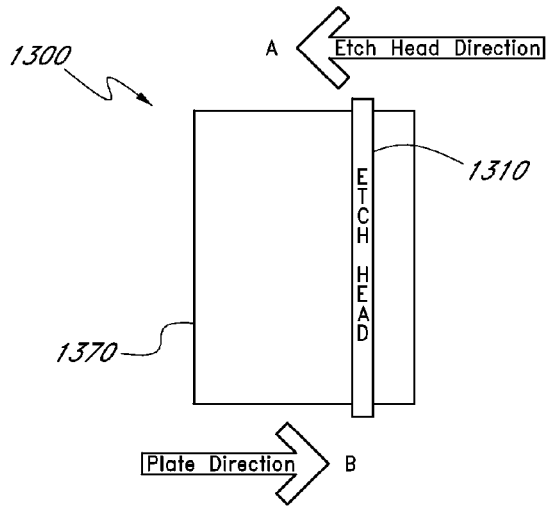
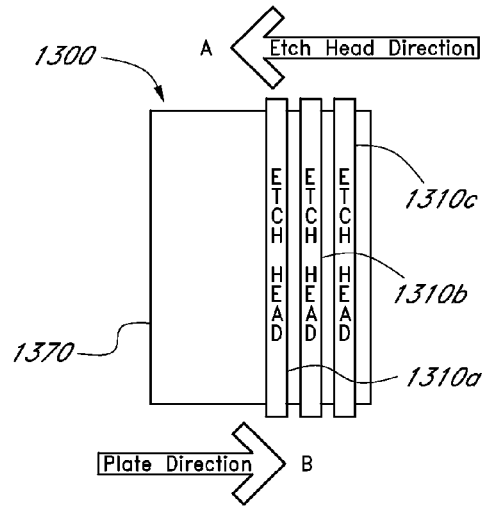
FIG. 13A  FIG. 13B
FIG. 14A  FIG. 15A  FIG. 16A
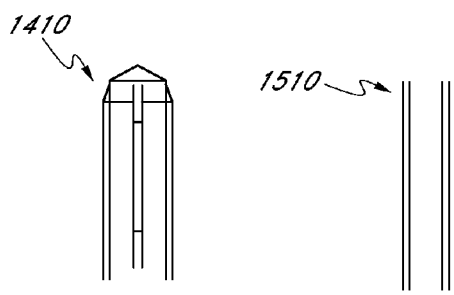
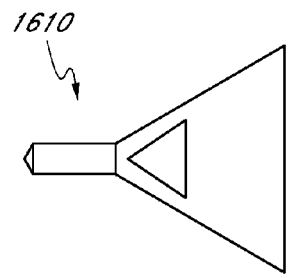
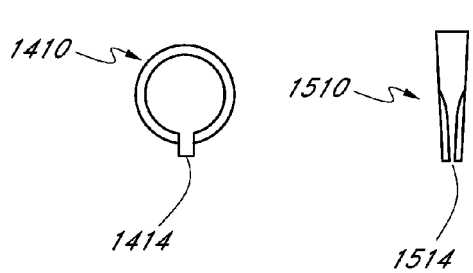
FIG. 14B  FIG. 15B  FIG. 16B

EQUIPMENT AND METHODS FOR ETCHING OF MEMS

CROSS-REFERENCE TO RELATED APPLICATIONS

The present application is the U.S. National Phase of International Application PCT/US2008/054222, filed Feb. 18, 2008, which claims priority benefit under 35 U.S.C. §119(e) to U.S. Provisional Application Ser. No. 60/890,824, filed Feb. 20, 2007, entitled "EQUIPMENT AND METHODS FOR ETCHING OF MEMS," the entirety of which is incorporated herein by reference.

BACKGROUND OF THE INVENTION

1. Technical Field

This application is generally related to microelectromechanical systems (MEMS) devices, and more particularly, equipment and methods for etching sacrificial layers to define cavities in MEMS.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

Etching equipment and methods are disclosed herein for more efficient etching of sacrificial material from between permanent MEMS structures. An etching head includes an elongate etchant inlet structure, which may be slot-shaped or an elongate distribution of inlet holes. A substrate is supported in proximity to the etching head in a manner that defines a flow path substantially parallel to the substrate face, and permits relative motion for the etching head to scan across the substrate.

An embodiment provides a method for etching a microelectromechanical systems (MEMS) device comprising: forming on a substrate a MEMS device comprising a sacrificial material; directing a gas stream comprising a gas phase etchant at a surface of the MEMS device through an elongate etching gas inlet; selectively etching at least a portion of the sacrificial material from between; and relatively moving the etching gas inlet and the substrate.

In some embodiments, forming on a substrate a MEMS device comprising a sacrificial material comprises forming on a substrate a MEMS device comprising a sacrificial material between two electrodes.

In some embodiments, directing the gas stream comprises flowing an inert gas. In some embodiments, directing the gas stream comprises producing a substantially laminar flow. In some embodiments, directing the gas stream comprises providing xenon difluoride. In some embodiments, directing the gas stream comprises flowing the gas stream normal to a surface of the MEMS device. In some embodiments, directing the gas stream comprises directing at least a portion of the gas stream substantially parallel to a surface of the MEMS device. In some embodiments, directing a gas stream through an elongate etching gas inlet comprises directing a gas stream through a slot-shaped nozzle. In some embodiments, directing a gas stream through a slot-shaped nozzle comprises directing a gas stream through a gas curtain nozzle. In some embodiments, directing a gas stream through an elongate etching gas inlet comprises directing a gas stream through a plurality of apertures. In some embodiments, directing a gas stream through an elongate etching gas inlet comprises directing a gas stream through an elongate gas inlet at least as long as a dimension of the substrate.

In some embodiments, selectively etching comprises forming a cavity in the MEMS device.

In some embodiments, relatively moving the etching gas inlet and the substrate comprises relatively moving the etching gas inlet and the substrate in a direction orthogonal to a long dimension of the etching gas inlet. In some embodiments, relatively moving the etching gas inlet and the substrate comprises substantially completely etching the sacrificial material from the MEMS device in a single pass. In some embodiments, relatively moving the etching gas inlet and the substrate comprises scanning the substrate back-and-forth under the etching gas inlet.

In some embodiments, directing a gas stream and relatively moving the etching gas inlet and the substrate occur contemporaneously.

Some embodiments further comprise withdrawing at least a portion of the gas stream through one or more exhaust openings after directing the gas stream.

Another embodiment provides an etching system comprising: an etching head comprising an etching gas inlet formed between a first flow guide surface and a second flow guide surface, wherein the etching head is operable to direct an etching gas substantially perpendicularly to the first flow guide surface and the second flow guide surface; and a substrate support operable to simultaneously support a substrate proximal to the etching gas inlet at a predetermined height and to move the substrate mounted thereon relative to the etching head, wherein the first and second flow guide surfaces are dimensioned and configured to guide the flow of a gas from the etching gas inlet substantially parallel to the substrate.

In some embodiments, the first and second flow guide surfaces and the predetermined height define an active etching zone with an aspect ratio of greater than about 10:1.

In some embodiments, the etching head further comprises at least one exhaust port, wherein one of the first and second flow guide surfaces is disposed between the at least one exhaust port and the etching gas inlet. Some embodiments comprise a first exhaust port and a second exhaust port.

In some embodiments, the etching gas inlet is elongated.

Another embodiment provides an etching system comprising: an etching head comprising a longitudinal axis; a first flow guide surface formed on the etching head, extending parallel to the longitudinal axis; and an etching gas inlet formed adjacent to the first flow guide surface, extending parallel to the longitudinal axis, wherein the flow guide surfaces are dimensioned and configured to redirect at least a portion of an etching gas from the etching gas inlet to form a flow of an etching gas substantially parallel to the flow guide surfaces.

Some embodiments further comprise a second flow guide surface formed on the etching head, extending parallel to the longitudinal axis, wherein the etching gas inlet is formed between the first and second flow guide surfaces.

In some embodiments, the first flow guide surface and a second flow guide surface together define a substantially flat surface.

In some embodiments, the etching gas inlet is elongated along the longitudinal axis.

Another embodiment provides an etching apparatus comprising: an elongate etching gas inlet extending in a first direction, the first direction defining a first side and a second side; a first elongate exhaust port parallel to the elongate etching gas inlet and spaced therefrom on the first side; a second elongate exhaust port parallel to the elongate etching gas inlet and spaced therefrom on the second side; a source of a gas phase etchant fluidly connected to the elongate etching gas inlet; and a source of vacuum fluidly connected to the first and second slots.

In some embodiments, the etching gas inlet comprises a gas curtain nozzle defining an etchant flow gap.

In some embodiments, the first and second exhaust ports each comprise an elongate slot, defining a first purge gap and a second purge gap, respectively.

Some embodiments provide a method for etching a microelectromechanical systems (MEMS) device comprising: providing a substrate comprising a MEMS device formed on a surface thereof, wherein the MEMS device comprises a sacrificial material; relatively moving an etching gas inlet and the substrate; directing a gas stream comprising a gas phase etchant at a surface of the MEMS device through the etching gas inlet; and selectively etching at least a portion of the sacrificial material from the MEMS.

In some embodiments, providing the substrate comprising the MEMS device comprises providing a substrate comprising a MEMS device comprising a sacrificial material disposed between two electrodes.

In some embodiments, directing the gas stream comprises directing a gas stream comprising an inert gas. In some embodiments, directing the gas stream comprises directing a gas stream with a substantially laminar flow. In some embodiments, directing the gas stream comprises directing a gas stream comprising xenon difluoride. In some embodiments, directing the gas stream comprises flowing the gas stream normal to a surface of the MEMS device. In some embodiments, directing the gas stream comprises directing at least a portion of the gas stream substantially parallel to a surface of the MEMS device. In some embodiments, directing the gas stream through the etching gas inlet comprises directing a gas stream through an elongate etching gas inlet. In some embodiments, directing the gas stream through the elongate etching gas inlet comprises directing the gas stream through a slot-shaped nozzle. In some embodiments, directing the gas stream through the slot-shaped nozzle comprises positioning substantially an entire longitudinal axis of the elongate etching gas inlet proximal to a surface of the MEMS device. In some embodiments, directing the gas stream through the slot-shaped nozzle comprises directing the gas stream through a gas curtain nozzle. In some embodiments, directing the gas stream through the elongate inlet comprises directing the gas stream through an elongate gas inlet at least as long as a dimension of the substrate.

In some embodiments, selectively etching comprises forming a cavity in the MEMS device.

In some embodiments, relatively moving the etching gas inlet and the substrate comprises relatively moving the etching gas inlet and the substrate in a direction orthogonal to a long dimension of the etching gas inlet. In some embodiments, relatively moving the etching gas inlet and the substrate comprises scanning the substrate under the etching gas inlet.

In some embodiments, directing the gas stream, and relatively moving the etching gas inlet and the substrate occur contemporaneously.

Some embodiments further comprise withdrawing at least a portion of the gas stream through at least one exhaust opening. In some embodiments, withdrawing at least the portion of the gas stream further comprises withdrawing an etching by-product.

Some embodiments provide an etching system comprising: an etching head comprising longitudinal axis, an etching gas inlet, and a first flow guide surface, wherein the first flow guide surface is disposed on a first side of the etching gas inlet, and the etching head is operable to direct an etching gas out of the etching gas inlet; and a substrate support operable to simultaneously support a substrate proximal to the etching gas inlet at a predetermined height and to translate the substrate mounted thereon relative to the etching head, wherein the first flow guide surface is dimensioned and configured to guide the flow of a gas from the etching gas inlet substantially parallel to the substrate.

In some embodiments, the first flow guide surface and the predetermined height define an active etching zone with an aspect ratio of greater than about 10:1.

In some embodiments, the etching head further comprises a first exhaust port, wherein the first flow guide surface is disposed between the first exhaust port and the etching gas inlet. In some embodiments, the etching head further comprises a second exhaust port, wherein a second flow guide surface is disposed on a second side of the etching gas inlet, and between the second exhaust port and the etching gas inlet.

In some embodiments, first exhaust port comprises an elongate slot substantially parallel to the longitudinal axis of the etching head. In some embodiments, the etching gas inlet comprises an elongate slot substantially parallel to the longitudinal axis of the etching head.

Some embodiments provide an etching apparatus comprising: an elongate etching gas inlet extending in a first direction, the first direction defining a first side and a second side; a first elongate exhaust port parallel to the elongate etching gas inlet and spaced therefrom on the first side; a second elongate exhaust port parallel to the elongate etching gas inlet and spaced therefrom on the second side; a source of a gas phase etchant fluidly connected to the elongate etching gas inlet; and a source of vacuum fluidly connected to the first and second exhaust ports.

In some embodiments, the etching gas inlet comprises a gas curtain nozzle defining an etchant flow gap.

In some embodiments, the first and second exhaust ports each comprise an elongate slot, defining a first purge gap and a second purge gap, respectively.

Some embodiments provide a method for etching a microelectromechanical systems (MEMS) device comprising: providing a substrate having a MEMS device formed on a surface of the substrate, wherein the MEMS device comprises a sacrificial material; directing a gas stream comprising a gas phase etchant towards the MEMS device through an etching gas inlet; selectively etching at least a portion of the sacrificial material with the gas phase etchant; and withdrawing at least a portion of the gas stream, contemporaneously with directing the gas stream, through at least one exhaust openings.

In some embodiments, providing the substrate comprising the MEMS device comprises providing a substrate comprising a MEMS device comprising a sacrificial material disposed between two electrodes.

In some embodiments, directing the gas stream comprises directing the gas stream through a gas curtain nozzle.

BRIEF DESCRIPTION OF THE DRAWINGS

FIG. 13A is a partial top view of an embodiment of an etching system comprising a single etching head. FIG. 13B is a partial top view of an embodiment of an etching system comprising a plurality of etching heads.

FIG. 14A is a top view of an end of and FIG. 14B is a cross section of an embodiment of a generally cylindrical etching head 1410.

FIG. 15A is a top view of a portion of and FIG. 15B is a cross section of an embodiment of a vertically tapered etching head 1510.

FIG. 16A is a front view of and FIG. 16B is a side of an embodiment of an etching head 1610 with a generally flattened-conical shape.

DETAILED DESCRIPTION OF SOME PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments of methods for manufacturing interferometric modulators and other MEMS include one or more steps in which a cavity is formed, which permits motion of certain components of the MEMS, as discussed in greater detail below. Etching equipment and methods are disclosed herein that efficiently etch sacrificial materials from between permanent MEMS structures. An etching head includes an elongate etchant inlet structure, which may comprise a slot-shaped opening and/or an elongated distribution of inlet holes. A substrate is supported in proximity to the etching head in a manner that defines a flow path substantially parallel to the substrate face, and permits relative motion for the etching head to scan across the substrate.

Figure 1:
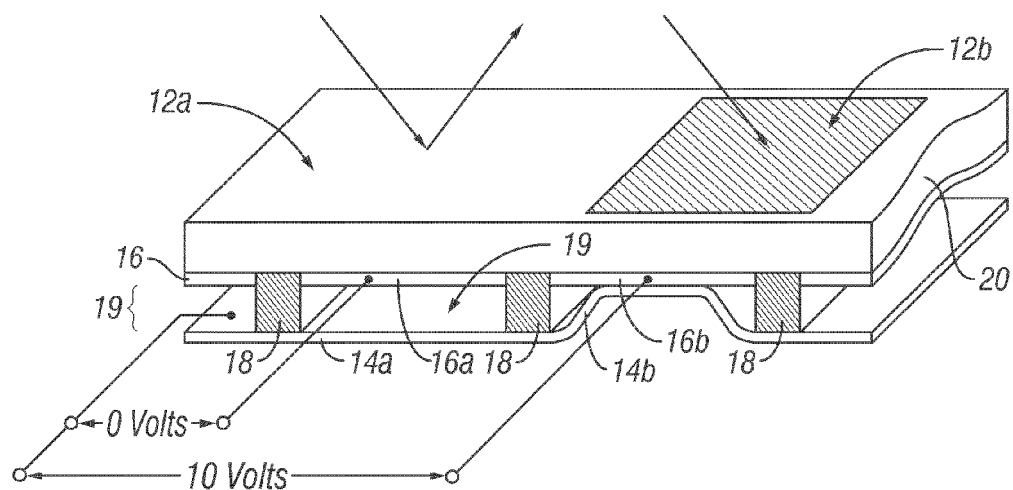
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in FIG. 1) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
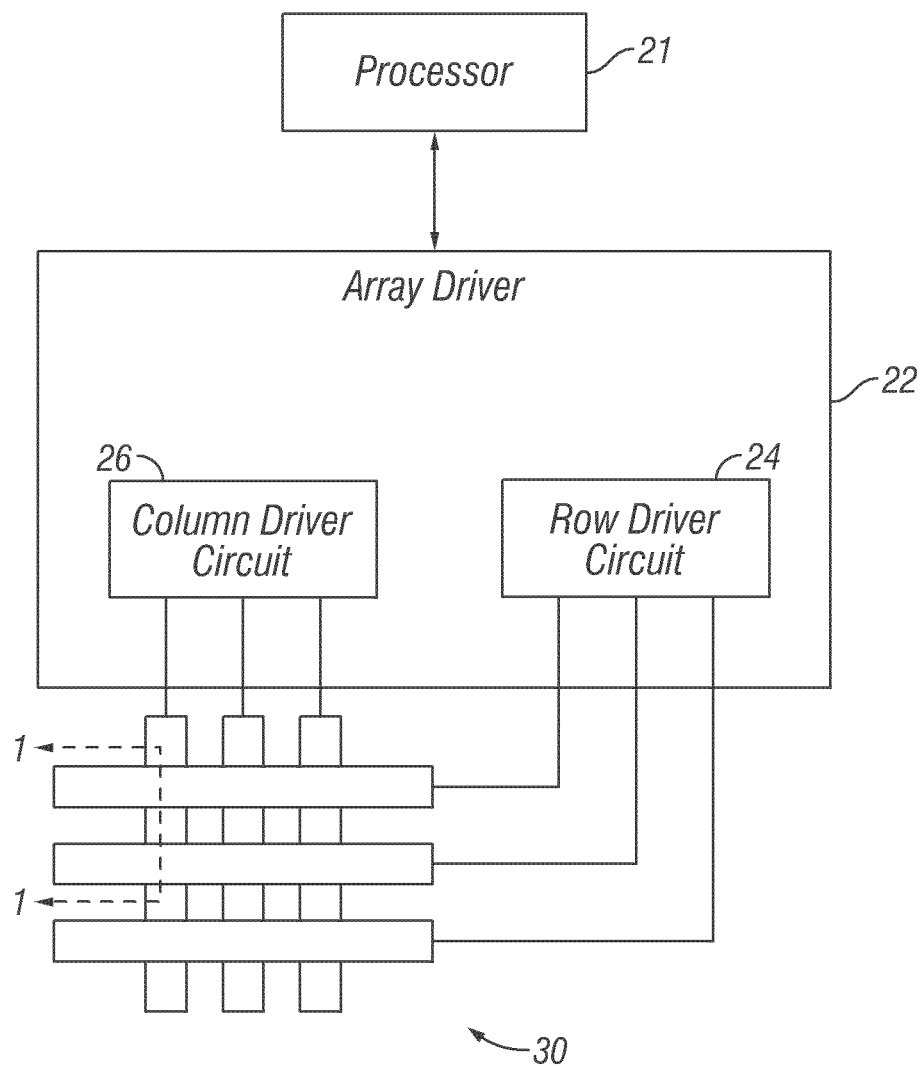
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
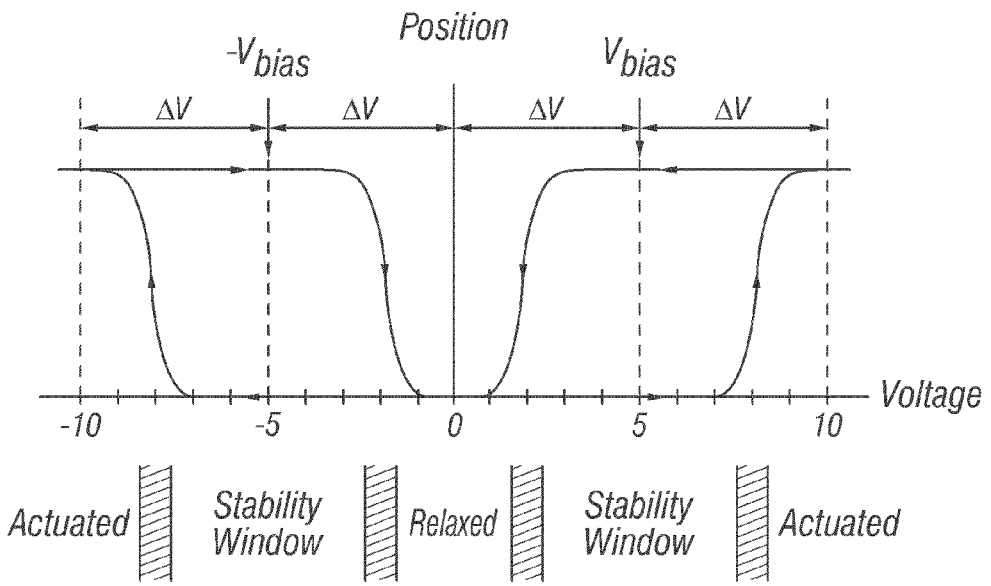
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
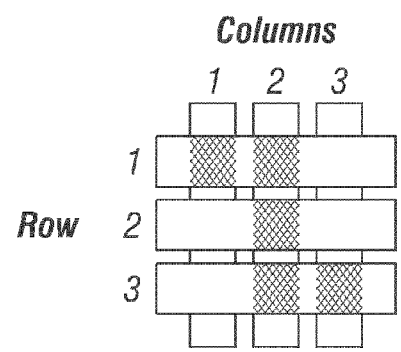
FIG. 5A illustrates one exemplary frame of display data in the 3×3 interferometric modulator display of FIG. 2.
Figure 5B:
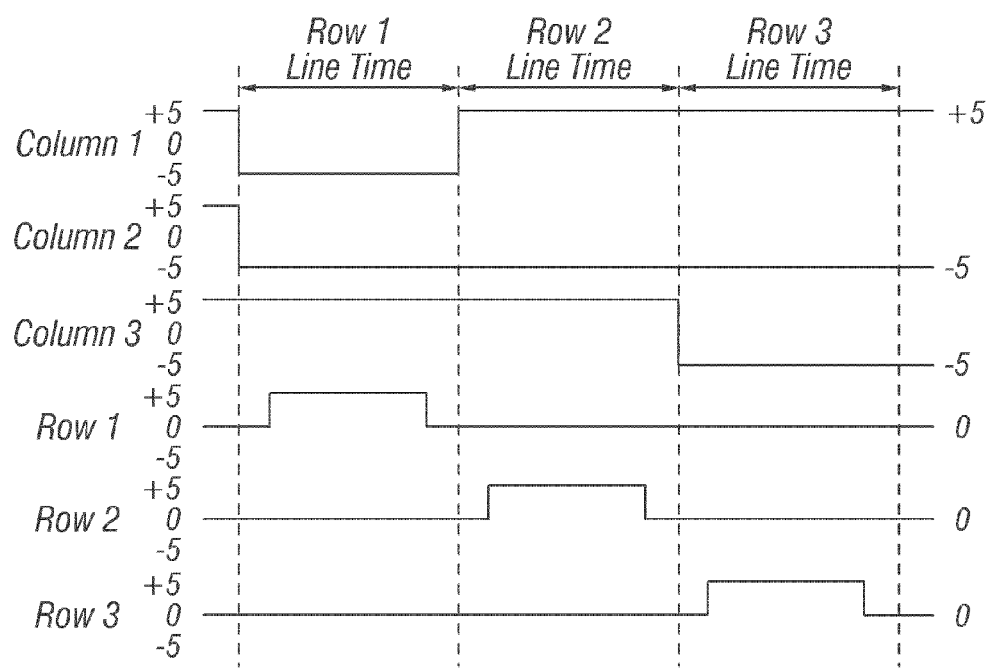
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
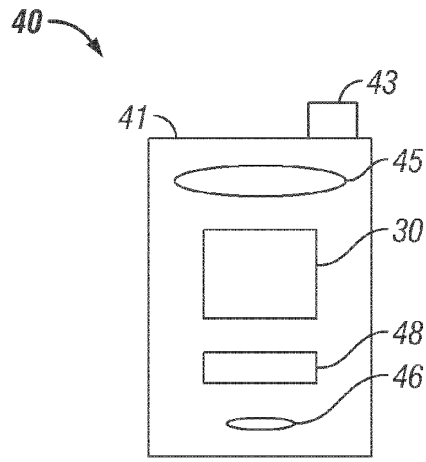
FIGS. 6A and 6B are system block diagrams illustrating an embodiment of a visual display device comprising a plurality of interferometric modulators.
Figure 6B:
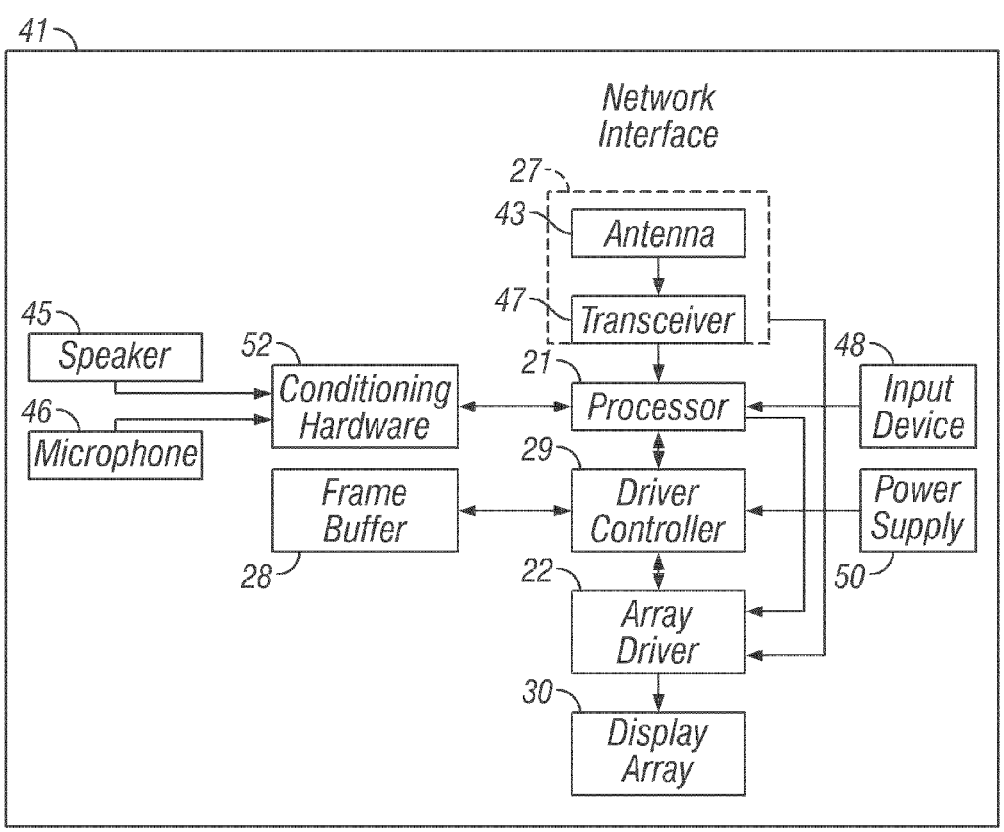

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
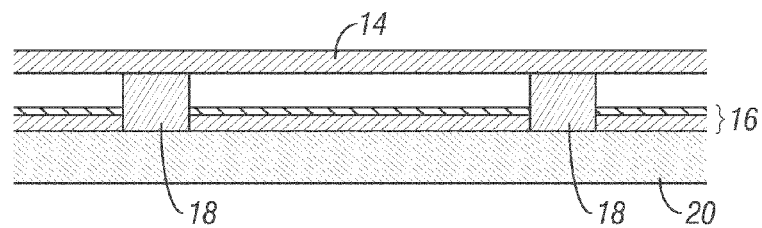
FIG. 7A is a cross section of the device of FIG. 1.
Figure 7B:
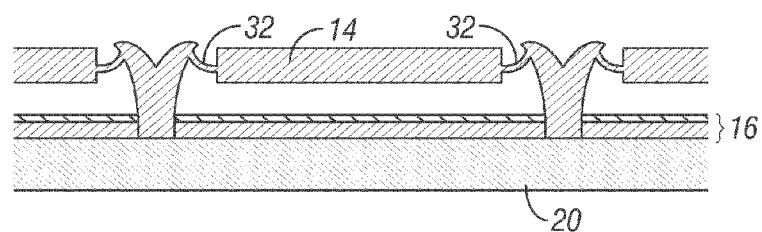
FIG. 7B is a cross section of an alternative embodiment of an interferometric modulator.
Figure 7C:
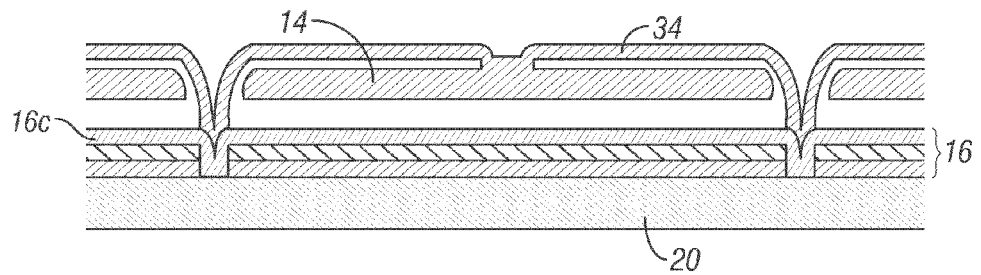
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections can take the form of continuous walls and/or individual posts. For example, parallel rails can support crossing rows of deformable layer 34 materials, thus defining columns of pixels in trenches and/or cavities between the rails. Additional support posts within each cavity can serve to stiffen the deformable layer 34 and prevent sagging in the relaxed position.

Figure 7D:
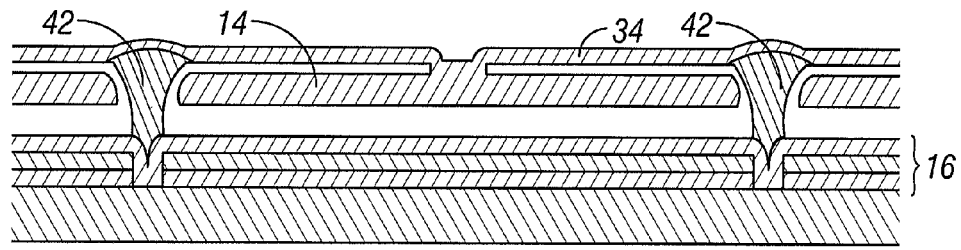
FIG. 7D is a cross section of yet another alternative embodiment of an interferometric modulator.
Figure 7E:
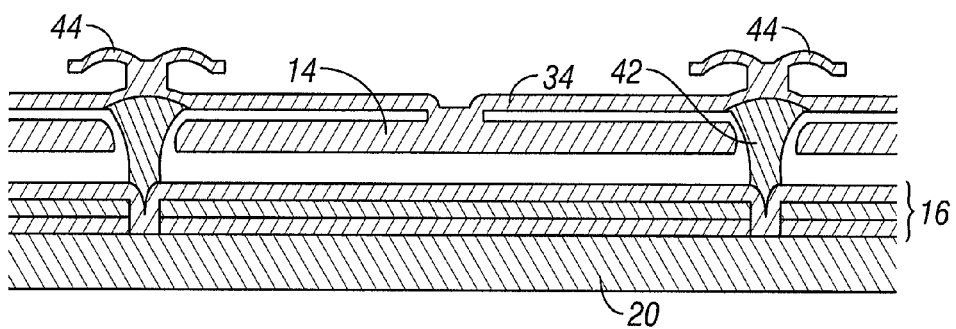
FIG. 7E is a cross section of an additional alternative embodiment of an interferometric modulator.

The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIGS. 7A-7E, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8A:
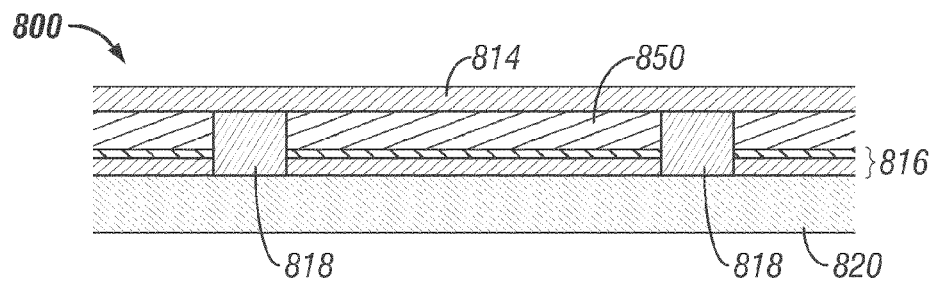
FIG. 8A-8E illustrate in cross section embodiments of unreleased interferometric modulators corresponding to the released interferometric modulators illustrated in FIGS. 7A-7E.
Figure 8B:
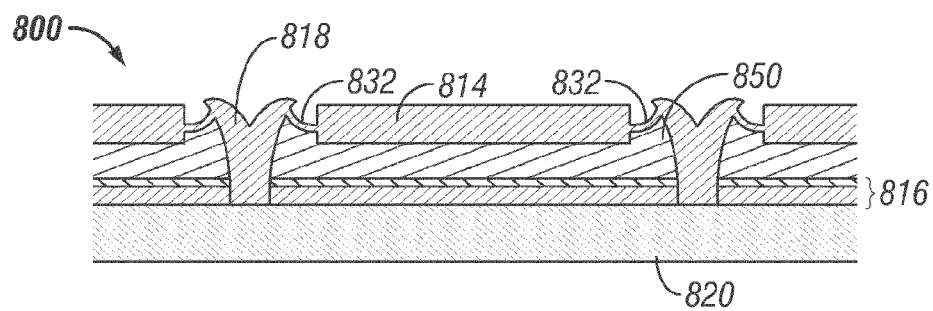
Figure 8C:
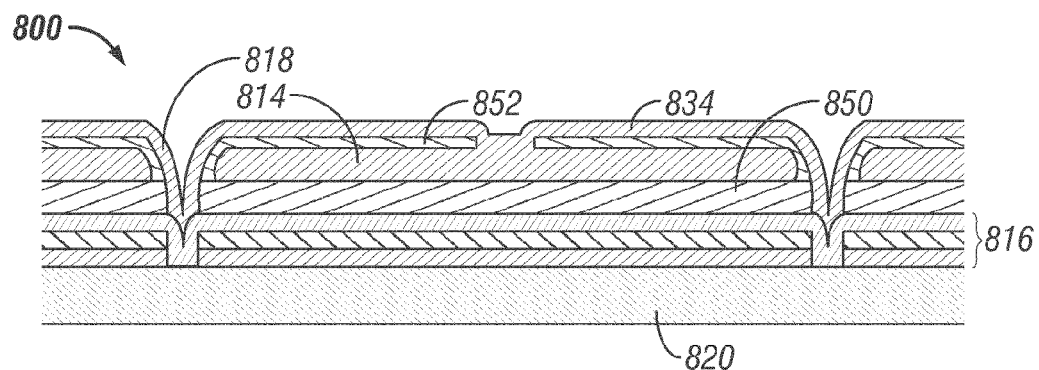
Figure 8D:
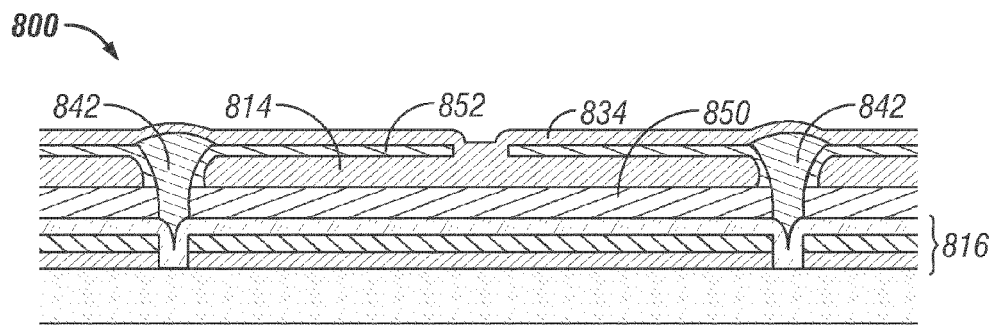
Figure 8E:
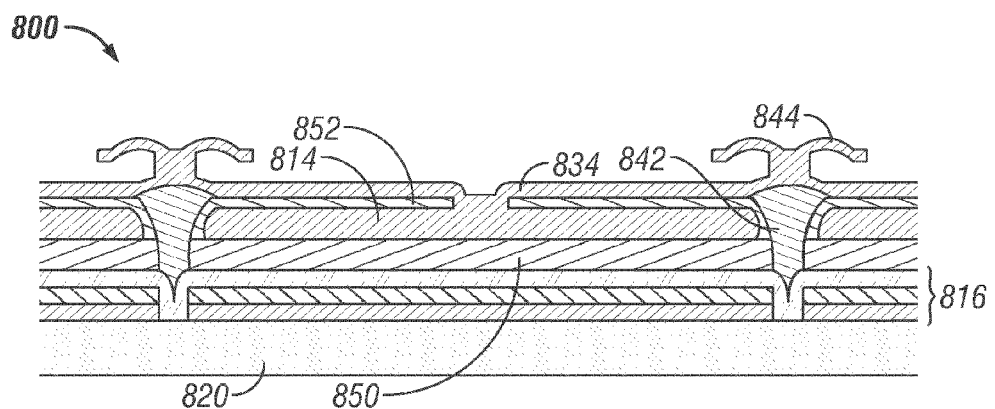

Embodiments of MEMS devices comprising movable components or elements are fabricated by a method in which a one or more sacrificial materials is removed or etched from a precursor structure, thereby creating a cavity or opening in the finished MEMS. Because such an etching step releases movable components from locked configurations in the precursor MEMS, such an etching step is referred to herein as a "release etch." Accordingly, the precursor MEMS is also referred to as "unreleased" MEMS. The sacrificial materials serve as placeholders in the manufacture of the MEMS, which comprise built-up patterned layers defining the MEMS. In particular, for electrostatic MEMS, sacrificial layers formed between stationary electrodes and movable electrodes occupy volumes that are cavities in the finished device. For example, FIGS. 8A-8E, illustrate unreleased interferometric modulators that correspond to the released interferometric modulators illustrated in FIGS. 7A-7E, respectively. The unreleased interferometric modulators 800 comprise a substrate 820 on which is formed an optical stack 816. A first sacrificial layer 850 is formed on the optical stack 816. A reflective layer 814 is formed on the sacrificial layer 850 and on support structures 818 that extend through the sacrificial layer 850. In the embodiments illustrated in FIGS. 8C-8E, a second sacrificial layer 852 is formed over the reflective layer 814, which is suspended from a deformable layer 834. In FIGS. 8A and 8B, the layer 814 represents both a deformable layer and a movable electrode or mirror. In some embodiments, the layer 814 comprises a plurality of sublayers, for example, with different optical and/or mechanical properties to provide a composite layer 814 with the desired properties. In FIGS. 8C-8E, the deformable layer 834 and movable electrode or mirror 814 are separate structures.

In some embodiments, the release etch comprises exposing the unreleased interferometric modulators to one or more etchants that selectively etch the first sacrificial layer 850 and, if present, the second sacrificial layer 852, thereby forming the cavities in the interferometric modulators illustrated in FIGS. 7A-7E, respectively, thereby releasing the reflective layer 814. In preferred embodiments, the release etch is performed using a vapor phase etchant that selectively etches both the first sacrificial layer 850 and the second sacrificial layer 852. The vapor phase etchant accesses the first sacrificial layer 850 and the second sacrificial layer 852 through one or more etch holes (not illustrated) formed in the deformable layer 834, through gaps between strips of the deformable layer 834, and/or from the sides of the device. In some preferred embodiments, the vapor phase etchant comprises one or more fluorine-based etchants, and in particular, vapor phase xenon difluoride ($XeF_2$). At ambient temperature, xenon difluoride is a solid with a vapor pressure of about 3.8 Torr (0.5 kPa at 25° C.). Vapor from xenon difluoride selectively etches certain sacrificial materials, that is, without forming a plasma.

In some preferred embodiments, the first sacrificial layer 850 and the second sacrificial layer 852 comprise one or more sacrificial materials that are selectively etchable by the etchant(s) over non-sacrificial or structural materials in the MEMS. Where the etchant is $XeF_2$, suitable sacrificial materials include silicon, titanium, zirconium, hafnium, vanadium, tantalum, niobium, molybdenum, tungsten, and combinations thereof. Preferred sacrificial materials where the etchant is $XeF_2$ include molybdenum, silicon, titanium, and combinations thereof.

Figure 9:
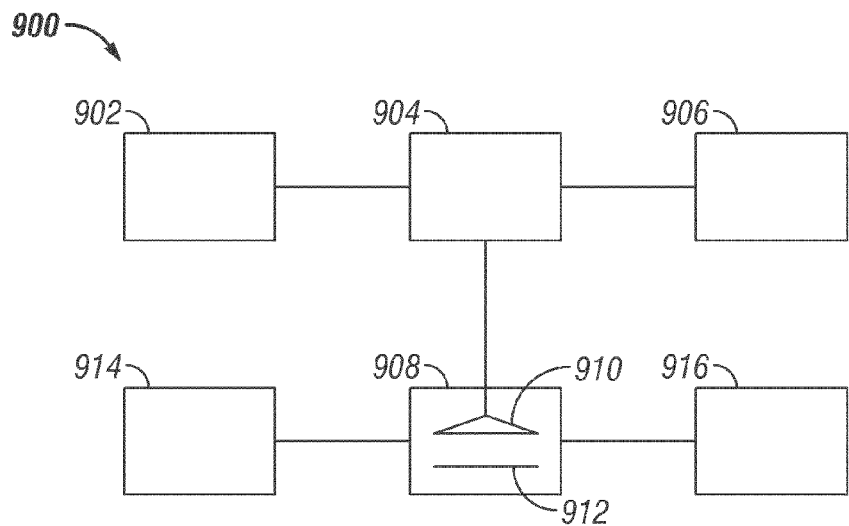
FIG. 9 schematically illustrates an embodiment of a soak-and-backfill etching device for sacrificial etching between electrodes of relatively large MEMS arrays.

FIG. 9 schematically illustrates an embodiment of an apparatus 900 for release etching unreleased MEMS using a vapor phase etchant, for example, $XeF_2$. This type of apparatus is also referred to herein as a "soak-and-backfill" apparatus. The apparatus 900 comprises a $XeF_2$ vessel 902, an expansion chamber 904, a first vacuum source 906, an etching chamber 908, a purge gas source 914, and a second vacuum source 916. The components are fluidly connected, as described below, through individually controllable valves, the control of which is automated in some embodiments. In some embodiments, the first 906 and second 916 vacuum sources are the same vacuum source.

Solid $XeF_2$ is disposed in the $XeF_2$ vessel 902, which is fluidly connected to the expansion chamber 904. The expansion chamber 904 is in turn fluidly connected to the first vacuum source 906 and the etching chamber 908. The expansion chamber 904 is fluidly connected to the etching chamber 908. In the illustrated embodiment, gas from the expansion chamber 904 enters the etching chamber 908 through an inlet such as a showerhead 910, which comprises a plurality of openings oriented proximally to a substrate support 912. The etching chamber 908 is fluidly connected to the purge gas source 914 and the second vacuum source 916.

In an exemplary embodiment of an etching process, the expansion chamber 904 is filled with $XeF_2$ gas using the following procedure. First, the expansion chamber 904 is evacuated using the first vacuum source 906. The expansion chamber 904 is then fluidly connected to the $XeF_2$ chamber 902, thereby filling the expansion chamber 904 with $XeF_2$ vapor. The valve between the $XeF_2$ chamber 902 and the expansion chamber 904 is then closed.

A substrate or a batch of substrates, on which one or more unreleased MEMS is fabricated, is loaded onto a substrate support 912 in the etching chamber 908. The etching chamber 908 is then evacuated using the second vacuum source 916. The etching chamber 908 is then fluidly connected to the expansion chamber 904, thereby filling the etching chamber 908 with $XeF_2$ vapor through the inlet 910 in a "backfill" step. The etching chamber 908 is then isolated while the substrate is etched by the $XeF_2$ vapor in a "soak" step. The etching chamber 908 is then purged of etching by-products using the purge gas 914 and second vacuum source 916. Additional etching cycles of evacuating, backfilling with $XeF_2$, soaking, and purging are performed until desired degree of etching is achieved.

The embodiment of the etching process described above using the soak-and-backfill apparatus 900 is generally a batch process, and as such, is not easily integrated into a continuous workflow. Moreover, changes in substrate configuration, for example, size, may necessitate redesign of the apparatus. The process cycle also involves steps in which no etching occurs, for example, when purging the etching chamber 908. Because the amount of sacrificial material in a MEMS array typically exceeds the amount of etchant that can be provided in the etching chamber 908 in a single backfill step, typical etching processes require multiple etching cycles, for example, up to about 50 cycles. Consequently, the throughput in some embodiments is about two substrates per hour. Improved throughput can be realized by ganging etching apparatus 900, for example, in a cluster-type tool; however, at a higher cost. Monitoring etching progress can also be difficult, resulting in high etchant consumption, as well as undesired etching of structural components for which the etchant is imperfectly selective.

Figure 10A:
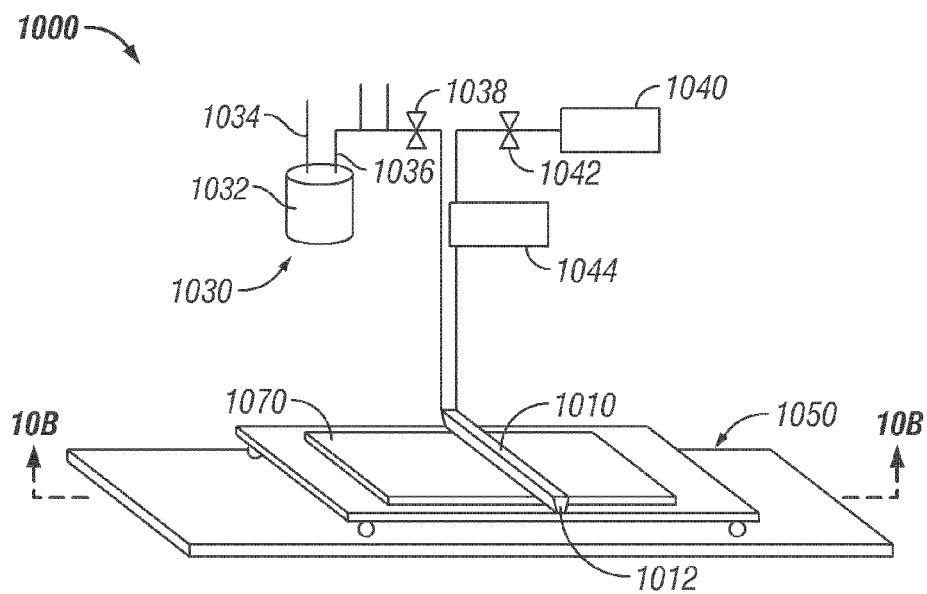
FIG. 10A schematically illustrates in perspective an embodiment of an improved etching system.

FIG. 10A illustrates a perspective view of an etching system 1000 comprising an etching head 1010, a source 1030 of an etching gas, a vacuum source 1040, and a substrate support 1050. A substrate 1070 on which one or more unetched MEMS devices is fabricated is supported on the substrate support 1050. In preferred embodiments, the unetched MEMS device is an element of one or more arrays of MEMS devices 1072 fabricated on the substrate 1070. In some embodiments, the etching system 1000 is disposed in a larger etching chamber or room, for example, to contain etching by-products and etchant, and/or to provide a controlled environment.

In the illustrated embodiment, the etching head 1010 is positioned above the substrate 1070, which is in turn supported by the substrate support 1050. In the illustrated embodiment, the etching head 1010 has an elongate structure with a long or longitudinal axis with a length slightly larger than the long dimension of the substrate 1070. MEMS substrates used in the manufacture of optical modulators, for example, the optical modulators illustrated in FIGS. 7A-7E, are typically glass, rectangular substrates, although those skilled in the art will understand that other substrate materials and other shapes are also used in other embodiments. Dimensions of preferred substrates include about 370 mm×470 mm (Gen 2), about 550 mm×650 mm (Gen 3), about 600 mm×720 mm (Gen 3.5), about 680 mm×880 mm, about 730 mm×920 mm (Gen 4), about 1100 mm×1250 mm, or larger. Those skilled in the art will understand that the illustrated etching system 1000 is also suitable for etching substrates with other dimensions, for example, narrower substrates. The ends 1012 of the etching head 1010 are closed. In the illustrated embodiment, the source 1030 of an etching gas is a source of a vapor phase etchant, for example, $XeF_2$ gas. The illustrated embodiment of the source 1030 comprises a canister 1032 comprising an inert gas inlet 1034 and a gas outlet 1036. In preferred embodiments, the canister 1032 is equipped with a heating unit suitable for sublimating solid the $XeF_2$ charged therein. Inert gas fed into the inert gas inlet 1034 entrains $XeF_2$ within the canister 1032, whereupon the gas mixture exits the gas outlet 1036 into a manifold into which additional process gases, for example, other inert gases, may be introduced. The manifold is fluidly connected to the etching head 1010 through a control valve 1038. The vacuum source 1040 is fluidly connected to the etching head 1010 through a control valve 1042. The illustrated embodiment also comprises a recycle unit 1044, which permits recycling of spent etching gas, as discussed in greater detail below.

The substrate support 1050 is of any suitable type, but preferably facilitates vertical positioning between the substrate 1070 and the etching head 1010, as well as their relative horizontal movement, as discussed in greater detail below. The etching head can be movable (e.g., like a print head) to enable scanning of the substrate. To avoid the complications inherent in providing a movable etching head, for example, flexible plumbing, maintaining alignment and registration, and the like, more preferably the substrate support 1050 is movable, either unidirectionally or in a reciprocating fashion in a direction generally perpendicular to the longitudinal axis of the etching head 1010. For example, the substrate support 1050 can be a belt conveyor, moving floor conveyor, roller conveyor, and the like. Some embodiments of the substrate support 1050 are also movable in another direction, for example, translatable generally parallel to the longitudinal axis of the etching head 1010, which permits lateral alignment of a substrate relative to the etching head 1010. Some embodiments of the substrate support 1050 permit rotational adjustment and/or vertical adjustment of the substrate. Some embodiments, both the substrate support 1050 and the etching head 1010 are movable. Embodiments of the substrate support 1050 also comprise a heater (not illustrated) for heating a substrate 1070 supported thereon in embodiments in which the etch chemistry can benefit from heat activation. The heater is of any suitable type, for example, resistive heaters, infrared heaters, heat lamps, combinations thereof, and the like.

Figure 10B:
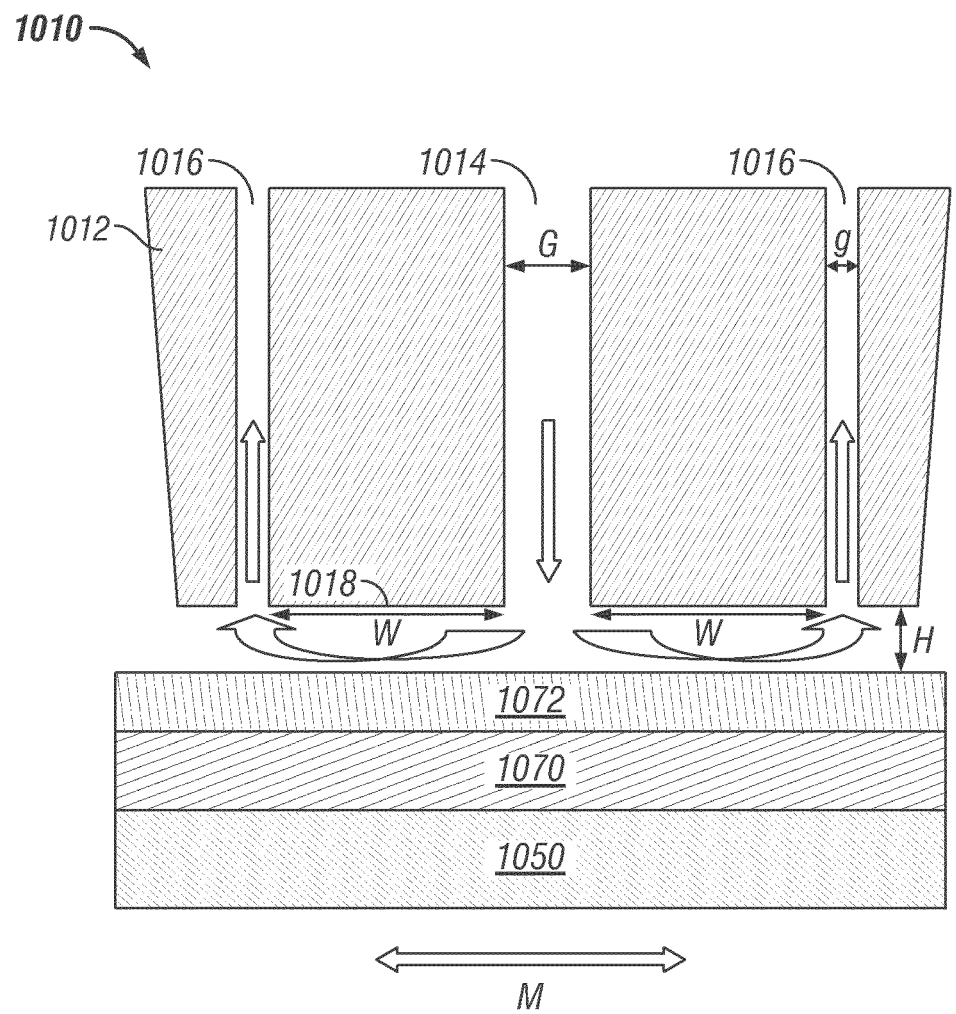
FIG. 10B schematically illustrates a cross section of an embodiment of an etching head in relation to a substrate mounted in proximity to the etching head.

FIG. 10B illustrates a cross section of an embodiment of the etching head 1010, substrate 1070, array of unreleased MEMS 1072, and substrate support 1050 taken along section B-B of FIG. 10A. In the illustrated embodiment, the substrate support 1050 is a conveyor system, which is capable of translating the substrate 1070 in the directions indicated by the double-headed arrow M. The etching head 1010 comprises an elongate body 1012 in which is formed an elongate etching gas inlet 1014 and a pair of exhaust ports 1016. In the illustrated embodiment, the exhaust ports 1016 are in the form of elongate slots, substantially parallel to the etching gas inlet 1014. In FIG. 10B, the body, 1012, gas inlet 1014, and exhaust ports 1016 extend in and out of the page. As will become apparent below, some embodiments of the etching head comprise a single exhaust port or no exhaust ports at all. In some embodiments, exhaust ports are provided in the etching chamber, preferably positioned and configured to draw the etching gases laterally across the surface of the substrate. The etching gas control valve 1038 (FIG. 10A) is fluidly connected to the etching gas inlet 1014, which directs the etching gas downward toward the substrate 1070. The vacuum control valve 1042 (FIG. 10A) is fluidly connected to the exhaust ports 1016, which withdraws spent etching gas away from the substrate 1070. The flow of etching gas through and under the etching head 1010 is indicated by arrows and is substantially parallel to the substrate 1070.

In preferred embodiments, the etching gas inlet 1014 is a gas curtain nozzle, which is also known in the art as an air knife nozzle or a gas knife nozzle. Embodiments of gas curtain nozzles are elongate structures comprising a slot or gap through which a feed gas exits as a gas curtain or knife. In preferred embodiments, the gas curtain has a substantially laminar flow. The etching gas inlet 1014 defines an etchant flow gap G through which the etching gas flows. In some embodiments, a width of the etchant flow gap G is from about 0.01 mm to about 10 mm, more preferably, from about 0.1 mm to about 5 mm.

Figure 10C:
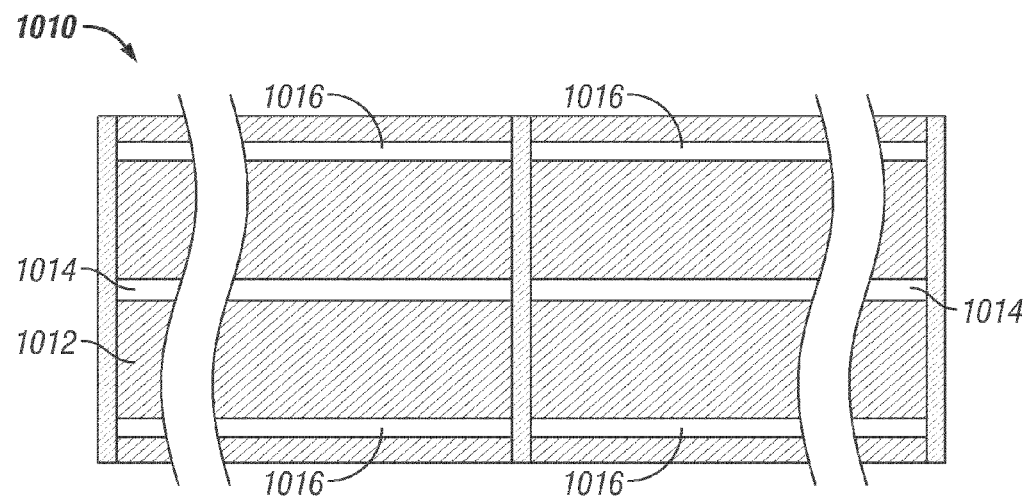
FIGS. 10C and 10D schematically illustrate bottom views of alternative embodiments of the etching head.
Figure 10D:
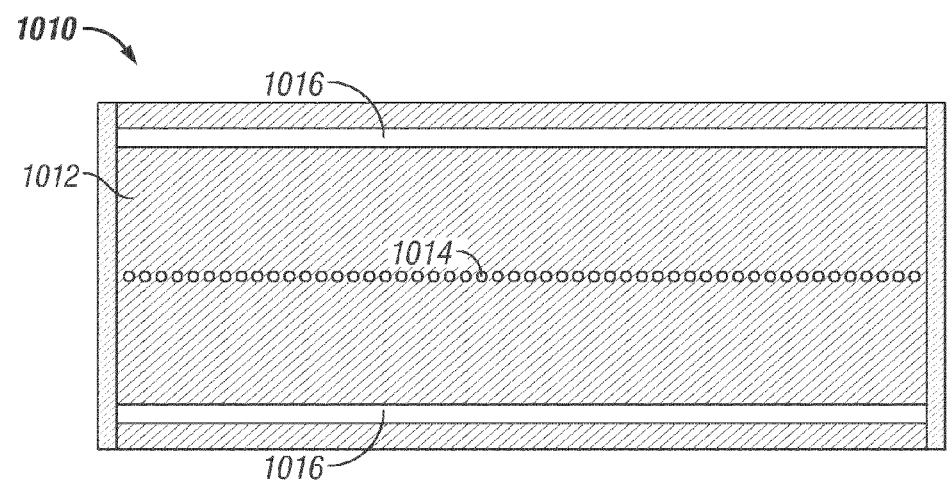

Some embodiments of the etching head 1010 comprise a plurality of etching gas inlets 1014 disposed in an elongate pattern, for example, linearly along the long axis, that is, end-to-end. For example, FIG. 10C illustrates a bottom view of an embodiment of an etching head 1010 comprising two aligned, elongate etching gas inlets 1014. FIG. 10D illustrates a bottom view of an embodiment of an etching head 1010, wherein the etching gas inlets 1014 comprise a plurality of perforations or a mesh. Embodiments of the gas inlets 1014 have one or more shapes, for example, circles, ellipse, polygons, and/or slots. Those skilled in the art will appreciate that in some embodiments, the inlet 1014 comprises a plurality of apertures or openings in another elongate pattern, that is, not in a single line. In some embodiments, the gas flow in at least some of the etching gas inlets 1014 or groups of etching gas inlets 1014 is independently controllable, that is, can be activated and deactivated as desired. Such an etching head permits etching substrates 1070 of different widths on the same etching system 1000, controlling the relative gas flow across the elongate or longitudinal axis, and/or etching selected portions of a substrate 1070.

Returning to FIG. 10B, the exhaust ports 1016 also define a reactant purge gap g through which spent etching gas and etching by-products are withdrawn from the active etching zone of substrate 1070. In other embodiments, the exhaust ports, 1016 comprise a plurality of apertures or openings arranged in an elongate pattern. As discussed above, some embodiments of the etching head 1010 comprise exhaust ports only on one side of the etching gas inlet 1014, or no exhaust ports at all, in which case, the etching chamber is preferably equipped with exhaust ports positioned and configured to provide the desired gas flow pattern. In some embodiments, a width of the reactant purge gap g is from about 0.01 mm to about 10 mm, more preferably, from about 0.1 mm to about 5 mm.

A flow guide surface 1018 with a width W separates each exhaust port 1016 from the etching gas inlet 1014. In the illustrated embodiment, the flow guide surfaces 1018 are substantially parallel to the substrate 1070. These flow guide surfaces 1018 define a width of an active etching zone under the etching head 1000. In preferred embodiments, a width W of the flow guide surface 1018 is from about 10 mm to about 300 mm, more preferably, 50 mm to about 200 mm. In some embodiments, the width W of the flow guide surfaces 1018 is the same for both exhaust ports 1016, while in other embodiments, the flow guide surfaces 1018 have different widths. The etching head 1010 and the substrate support 1050 are arranged such that the etching head 1010 is spaced above the array 1072 by a height H, which in some embodiments, is from about 0.5 mm to about 25 mm, more preferably, from about 1 mm to about 10 mm. This height H defines a height of the active etching zone. In the illustrated embodiment, the active etching zone is relatively wide (2W) compared with its height H. Accordingly, the flow guide surfaces 1018 redirect the etching gas into a generally horizontal flow substantially parallel to the substrate 1070. In some embodiments, the aspect ratio (2W:H in the illustrated embodiment) of the active etching area is greater than about 2:1, preferably, greater than about 10:1, more preferably, greater than about 50:1. The parallel flow provides predictable etchant-to-MEMS contact in the active etching zone, predictable etching times, and efficient usage of the vapor phase etchant. It will be understood that, even in embodiments where the exhaust port(s) are located in an etching chamber, rather than in the etching head 1010, the flow guide surfaces 1018 serve to define a confined, substantially parallel flow path between the etching head 1010 and the substrate to ensure residence time for efficient etching of the MEMS substrate 1070, and particularly the sacrificial layer therein. Those skilled in the art will understand that the residence time of the etching gas in the active etching zone will depend on factors including the pressure of the etching gas, the pressure of the vacuum source, the dimensions of the active etching zone, the dimension of the etchant flow gap G, and the dimensions of the reactant purge gap g.

Some embodiments of the etching head 1010 further comprise a heater (not illustrated) that permits adjusting the temperature of the etching gas. The heater is of any suitable type, for example, a resistive heater. In some embodiments, a temperature control is provided by circulating a fluid through one or more channels formed in the etching head 1010 that are fluidly isolated from the gas inlet 1014 and the exhaust port(s) 1016. In some embodiments, the temperature of the etching gas is adjusted before it enters the etching head 1010.

Figure 10E:
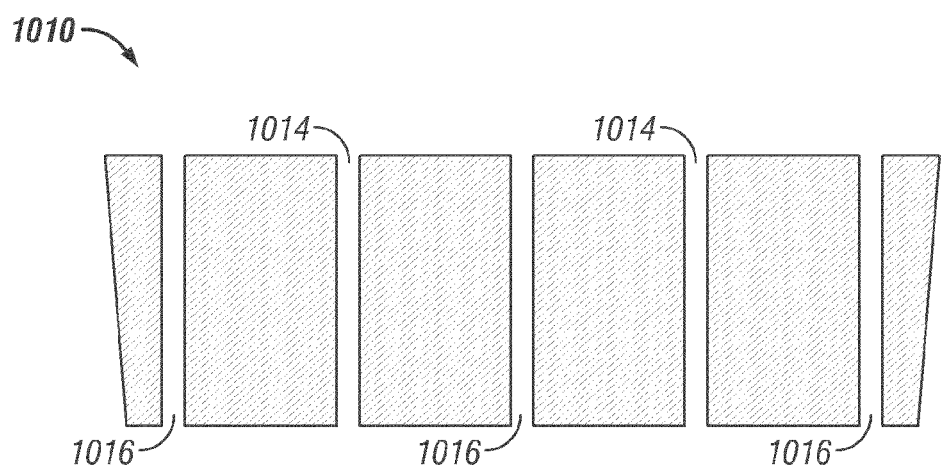
FIG. 10E schematically illustrates a cross section of an alternative embodiment of the etching head.

Another embodiment of an etching head 1010 illustrated in FIG. 10E increases the width of the active etching zone by adding an additional etching gas inlet 1014 and exhaust port 1016. Those skilled in the art will understand that additional etching gas inlet 1014 and exhaust ports 1016 can be added in other embodiments.

Another embodiment of the etching head 1010 (not illustrated) is similar to the etching head of FIG. 10B, except comprising only one flow guide surface 1018 and one associated exhaust port 1016. In preferred embodiments, the flow guide surface 1018 and exhaust port 1016 are provided on the downstream side of the etching head 1010 with reference to the relative motion between the etching head 1010 and substrate 1070. In some embodiments, the etching gas inlet 1014 is also angled toward the downstream side of the etching head 1010.

As discussed above, the illustrated embodiment comprises a recycle unit 1044 for capturing unreacted etching gas and/or etching by-products. In some embodiments, unreacted $XeF_2$ in the exhausted gas is recovered for future use, for example, by recondensing the vapor phase $XeF_2$ into the solid state, for example, using a cold trap or the like. In some embodiments, etching by-products are removed from the exhausted gas stream by means known in the art, for example, filtering, adsorption, chemisorption, physisorption, reacting, condensing, combinations, and the like.

Some embodiments of the etching system 1000 further comprise a monitoring system (not illustrated) for monitoring the progress of the release etch. Some embodiments of the monitoring system monitor concentrations of by-products of the etching reaction and/or etchant, for example, in the exhausted etching gas stream. Suitable methods are for such monitoring known in the art, for example, spectroscopy, mass spectroscopy, infrared spectroscopy, UV-visible spectroscopy, Raman spectroscopy, microwave spectroscopy, nuclear magnetic resonance spectroscopy, combinations, and the like. In some embodiments, etching progress is monitored by directly monitoring the MEMS during the release etch processes. For example, in some embodiments, the reflectance of an optical modulator or array of optical modulators is monitored to assess etching progress.

Figure 11:
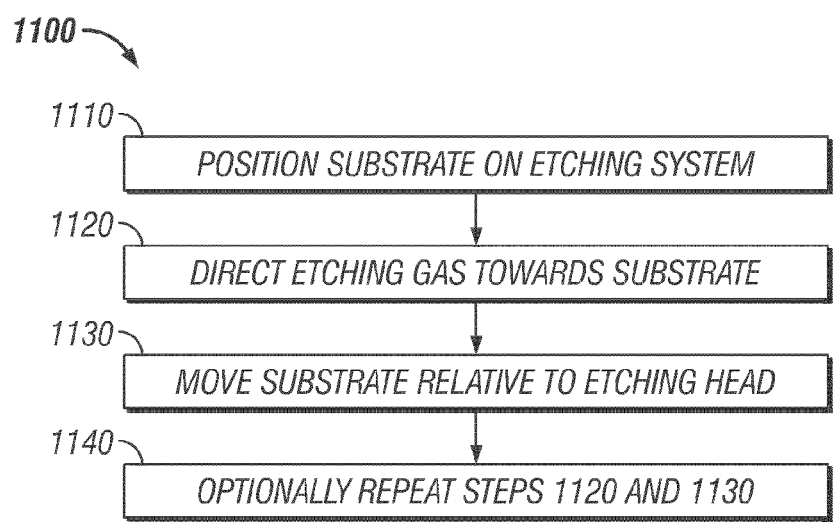
FIG. 11 is a flowchart illustrating an embodiment of a method for etching unreleased MEMS using the etching system illustrated in FIGS. 10A-10E.

FIG. 11 is a flow chart illustrating an embodiment of a method 1100 for release etching an unreleased MEMS with reference to the etching system 1000 illustrated in FIGS. 10A-10E as an example of a suitable etching apparatus for carrying out the method. Those skilled in the art will understand that the method 1100 may be practiced on other devices as well.

In step 1110, a substrate 1070 comprising an unreleased MEMS is mounted on the substrate support 1050 and positioned below the etching head 1010. In some embodiments, the substrate 1070 is mounted such that a longer edge corresponds to the length or longitudinal axis of the etching head 1010, and a shorter edge corresponds to the direction of the relative motion between the substrate support 1050 and the etching head 1010. Embodiments of such an arrangement provide a shorter etch time because the active etching zone covers a larger proportion of the substrate in such a configuration.

In step 1120, as etching gas is directed through an etching gas inlet 1014 of an etching head 1010 at a surface of a substrate 1070 on which an unreleased MEMS is formed. In some embodiments, the gas flow is adjusted to provide a generally laminar flow in at least a portion of an active etching zone. An active etching zone on the substrate 1070 is defined as discussed above by releasing fresh etching gas from the etching gas inlet 1014 and withdrawing spent etching gas and etching by-product through the exhaust ports 1016. The etching gas contacts the sacrificial material in the active etching zone, thereby etching at least a portion of the sacrificial material. Optionally, the substrate 1070 is heated using the heating device in the substrate support 1050 to accelerate the etching.

The design of the etching head provides a uniform etching in the active etching zone. Referring again to FIG. 10B, the concentration of the vapor phase etchant is highest directly under the etching gas inlet 1014. Accordingly, etching is fasted in this portion of the active etching zone. The concentration of the vapor phase etchant decreases as the etching gas moves towards the exhaust ports 1016. Consequently, the etching rate is lowest just below the exhaust ports 1016. Those skilled in the art will understand that dimensions of the etching head 1010, height H of the etching head from the array 1072, concentration of vapor phase etchant, pressure of the etching gas, pressure of the vacuum source may be selected for a particular substrate such that the concentration of the vapor phase etchant in the exhaust is very low, thereby conserving the vapor phase etchant. For example, in some embodiments, from about 80% to about 99%, more preferably, from about 85% to about 99%, of the vapor phase etchant, is reacted before the etching gas is exhausted through the exhaust ports 1016.

It will be appreciated that, within the constraints of substantially parallel flow from the inlet 1014 along the substrate surface, and low profile (preferably, about 0.5-25 mm, more preferably about 1-10 mm), a small angle between the flow guide surface of the etching head 1010 and the substrate (as constrained by the substrate support 1050) can help to tune the efficiency of the process. Particularly, angles between about 0° and about 10° from parallel allow tuning of the local pressure and flow rates.

In step 1130, the substrate 1070 is moved relative to the etching head 1010, thereby moving the active etching zone over another portion of the unreleased MEMS or array of MEMS. In the embodiment of FIG. 10B the substrate 1070 is moved by the movable substrate support 1050 in the directions indicated by the double-headed arrow M. In some embodiments, the etching head 1010 moves in addition to or instead of the substrate 1070 moving.

In preferred embodiments, steps 1120 and 1130 are performed simultaneously, that is, the etching gas is directed from the etching head 1010 at the same time that the etching head 1010 and substrate 1070 are relatively displaced in a continuous fashion.

In optional step 1140, steps 1120 and 1130 are repeated until the etching is complete, as determined, for example, by monitoring the etching process as discussed above. In some preferred embodiments, complete release etching of the MEMS is achieved in a single pass or scan of the etching head 1010. The etching gas residence time is adjusted, as described above, in conjunction with the velocity of the substrate 1070. In some embodiments, a speed of the conveyor system 1070 is adjusted according to the monitoring system to permit single-pass release.

In other embodiments, the MEMS is etched in multiple passes. For example, in some embodiments, the entire substrate 1070 is scanned back-and-forth under the etching head 1010 by the substrate support 1050 until etching is complete. In other embodiments, the substrate 1070 is disposed in a starting position, scanned, then returned to the starting position and etched again. As discussed above, in some embodiments, the etching head 1010 is moved over the substrate 1070.

In other embodiments, a plurality of generally parallel etching heads 1010 is provided such that a region of the substrate 1070 passes sequentially under the active etching zone of each etching head 1010 as the substrate 1070 is transported by the substrate support 1050. For comparison, FIG. 13A is a partial top view of an embodiment of an etching system 1300 similar to the system illustrated in FIGS. 10A and 10B showing an etching head 1310 and a substrate 1370. In the illustrated embodiment, a longitudinal axis of the etching head 1310 is longer than and generally parallel to a longer edge of the substrate 1370. The relative motion of the etching head 1310 to the substrate 1370 is indicated by the arrow A, and the relative motion of the substrate 1370 to the etching head 1310 is indicated by the arrow B.

FIG. 13B is a partial top view of an embodiment of an etching system 1300 that is similar to the system illustrated in FIG. 13A, and which comprises a plurality of etching heads 1310a, 1310b, and 1310c disposed over a substrate 1370. The relative motion of the etching heads 1310a, 1310b, and 1310c to the substrate 1370 is indicated by the arrow A, and the relative motion of the substrate 1370 to the etching heads 1310a, 1310b, and 1310c is indicated by the arrow B. Embodiments of etching systems comprising a plurality of etching heads provide at least one of improved etching control and faster etching. For example, in some embodiments, gas flow in each of the etching heads 1310a, 1310b, and 1310c is independently controllable. Those skilled in the art will understand that other embodiments use a different number of etching heads.

Those skilled in the art will understand that any suitable etching head is useful in the devices, systems, and/or methods. For example, FIG. 14A is a top view of an end of and FIG. 14B is a cross section of an embodiment of a generally cylindrical etching head 1410 comprising a gas outlet 1414. FIG. 15A is a top view of a portion of and FIG. 15B is a cross section of an embodiment of a vertically tapered etching head 1510 comprising a gas outlet 1514. FIG. 16A is a front of and FIG. 16B is a side of an embodiment of an etching head 1610 with a generally flattened-conical shape. Although the embodiments illustrated in FIGS. 14A-16B do not comprise exhaust ports, those skilled in the art will understand that other embodiments include one or more exhaust ports as described above.

EXAMPLE 1

Figure 12A:
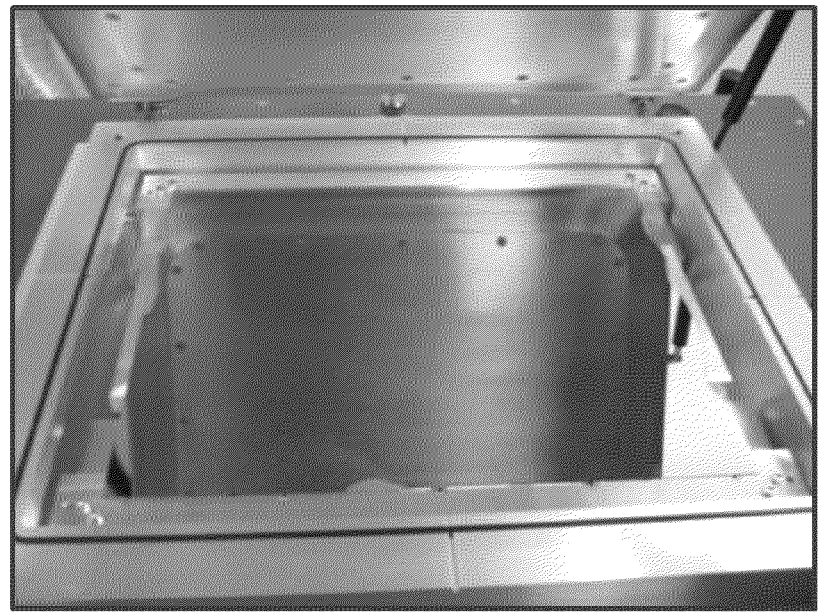
FIGS. 12A-12G illustrates test substrates etched in a soak-and-backfill etching system similar to that of FIG. 9.
Figure 12B:
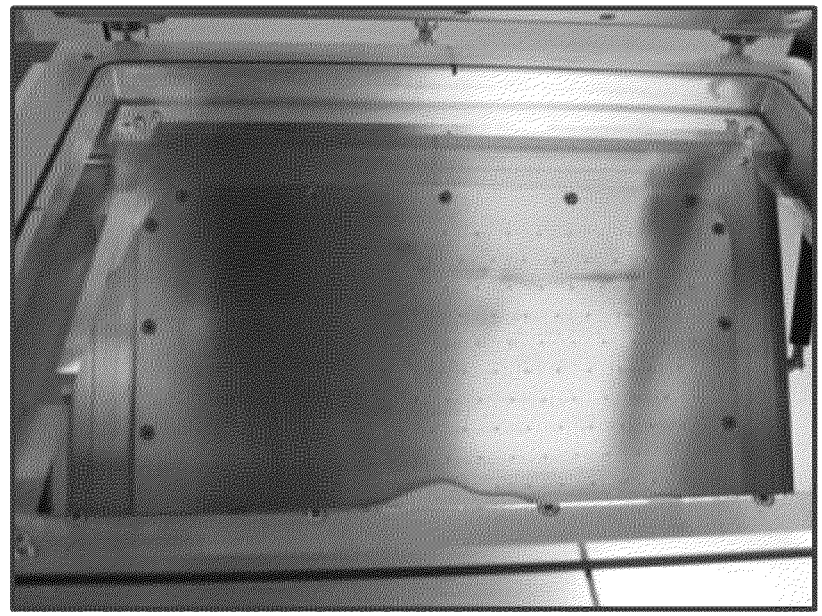
Figure 12C:
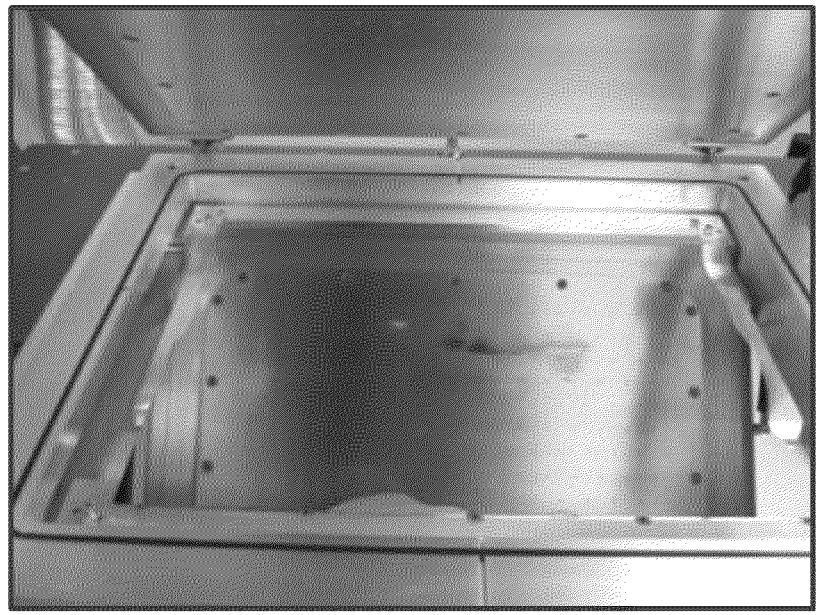
Figure 12D:
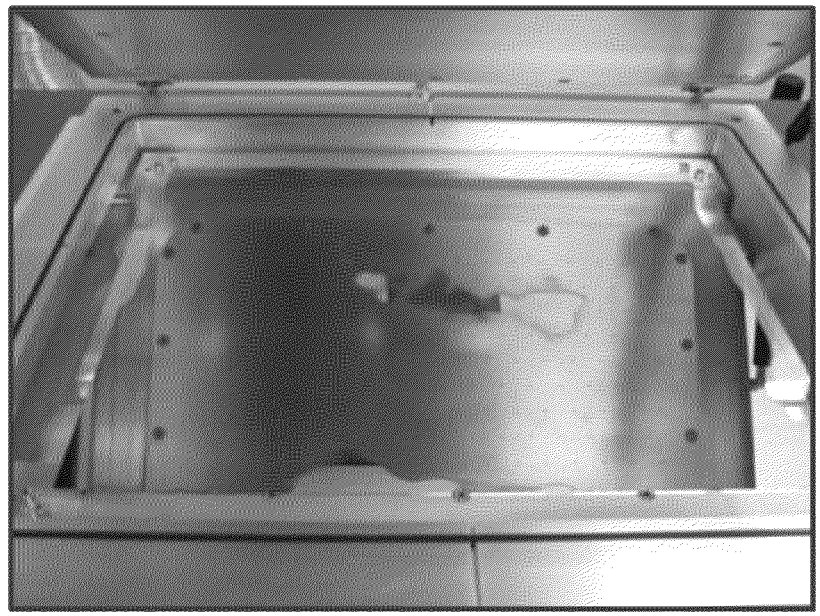
Figure 12E:
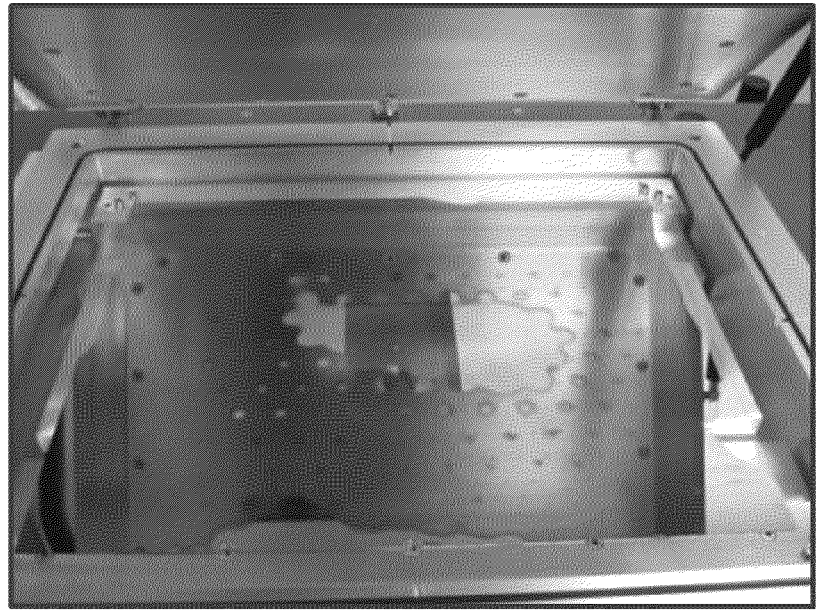
Figure 12F:
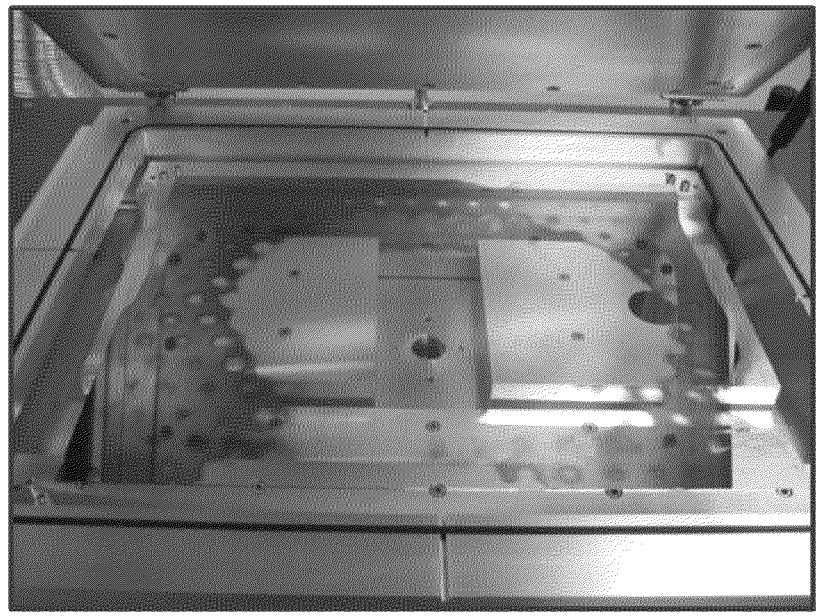
Figure 12G:
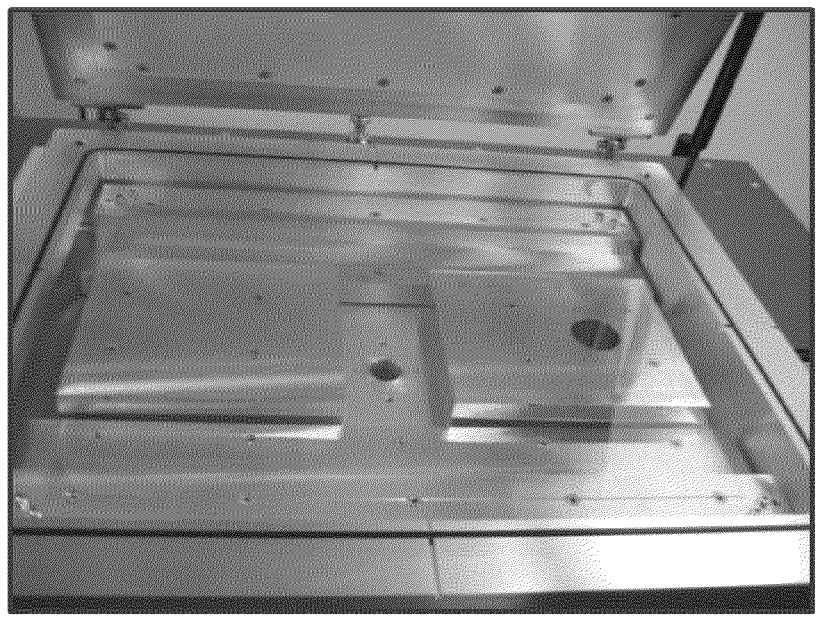

On a glass substrate (370 mm×470 mm×2.5 mm) was deposited a molybdenum film (150 nm) by physical vapor deposition. The coated substrate was loaded into a soak and backfill etching apparatus as described above and illustrated in FIG. 9, and etched using $XeF_2$ vapor. After 10 etching cycles, the no etching was observed as illustrated in FIG. 12A. After 20 cycles, a pattern was formed on the molybdenum corresponding to the pattern of openings on the showerhead of the etching chamber as illustrated in FIG. 12B. After 30 cycles, some etching was also observed around the center of the substrate as illustrated in FIG. 12C. At 40, 50, and 60 cycles, the etched area in the center of the substrate grew, along with regions around the openings of the showerhead, as illustrated in FIGS. 12D-121F. Etching was complete after 70 cycles, as illustrated in FIG. 12G.

EXAMPLE 2

An array of unreleased interferometric modulators similar to the embodiment illustrated in FIG. 8A are fabricated on glass substrate (370 mm×470 mm), on which is deposited the following layers: an indium tin oxide conductive layer, 80 Å of a molybdenum/chromium partial reflective layer, 400-500 Å of a silicon dioxide dielectric layer, 2000 Å of a molybdenum sacrificial layer, 300 Å of an aluminum movable reflective layer, and 1000 Å of a nickel deformable layer.

An gas curtain (air knife) etching head of the type illustrated in FIG. 10B is positioned above a conveyer system on which the array is disposed, with the etching head above and parallel to a 470 mm edge of the array. A stream of $XeF_2$ in nitrogen at ambient temperature is provided to the etching gas inlet and the exhaust ports connected to a vacuum source. The array is moved below the etching head by the conveyer and the sacrificial layer etched away in a single pass.

Those skilled in the art will understand that changes in the apparatus and manufacturing process described above are possible, for example, adding and/or removing components and/or steps, and/or changing their orders. Moreover, the methods, structures, and systems described herein are useful for fabricating other electronic devices, including other types of MEMS devices, for example, other types of optical modulators.

Moreover, while the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method for etching a microelectromechanical systems (MEMS) device comprising:
    providing a substrate comprising a MEMS device formed on a surface thereof, wherein the MEMS device comprises a sacrificial material disposed between two electrodes;
    relatively moving an etching gas inlet and the substrate;
    directing a gas stream comprising a gas phase etchant at a surface of the MEMS device through the etching gas inlet, wherein directing the gas stream comprises flowing at least a portion of the gas stream along at least one flow guide surface arranged adjacent to the etching gas inlet, and the flow guide surface is configured to guide the gas stream from the etching gas inlet substantially parallel to the substrate, wherein the first flow guide surface and a height between the first flow guide surface and the substrate define an active etching zone with an aspect ratio of a width of the first flow guide surface to the height greater than about 10:1; and
    selectively etching to remove the sacrificial material from between the two electrodes of the MEMS.

2. The method of claim 1, wherein selectively etching further comprises selectively removing a second sacrificial layer formed over a reflective layer, wherein the reflective layer is part of one of the two electrodes.

3. The method of claim 1, wherein directing the gas stream comprises directing a gas stream comprising an inert gas.

4. The method of claim 1, wherein directing the gas stream comprises directing a gas stream with a substantially laminar flow.

5. The method of claim 1, wherein directing the gas stream comprises directing a gas stream comprising xenon difluoride.

6. The method of claim 1, wherein directing the gas stream comprises flowing the gas stream normal to a surface of the MEMS device.

7. The method of claim 1, wherein directing the gas stream through the etching gas inlet comprises directing a gas stream through an elongate etching gas inlet.

8. The method of claim 7, wherein directing the gas stream through the elongate etching gas inlet comprises directing the gas stream through a slot-shaped nozzle.

9. The method of claim 8, wherein directing the gas stream through the slot-shaped nozzle comprises positioning substantially an entire longitudinal axis of the elongate etching gas inlet proximal to a surface of the MEMS device.

10. The method of claim 8, wherein directing the gas stream through the slot-shaped nozzle comprises directing the gas stream through a gas curtain nozzle.

11. The method of claim 7, wherein directing the gas stream through the elongate inlet comprises directing the gas stream through an elongate gas inlet at least as long as a dimension of the substrate.

12. The method of claim 1, wherein selectively etching comprises forming one or more cavities in the MEMS device.

13. The method of claim 1, wherein relatively moving the etching gas inlet and the substrate comprises relatively moving the etching gas inlet and the substrate in a direction orthogonal to a long dimension of the etching gas inlet.

14. The method of claim 1, wherein relatively moving the etching gas inlet and the substrate comprises scanning the substrate under the etching gas inlet.

15. The method of claim 1, wherein directing the gas stream, and relatively moving the etching gas inlet and the substrate occur contemporaneously.

16. The method of claim 1, further comprising withdrawing at least a portion of the gas stream through at least one exhaust opening.

17. The method of claim 16, wherein withdrawing at least the portion of the gas stream further comprises withdrawing an etching by-product.

18. A method for etching a microelectromechanical systems (MEMS) device comprising:
    providing a substrate having a MEMS device formed on a surface of the substrate, wherein the MEMS device comprises a sacrificial material disposed between two electrodes;
    directing a gas stream comprising a gas phase etchant towards the MEMS device through an etching gas inlet, wherein directing the gas stream comprises flowing the gas stream along at least one flow guide surface arranged adjacent to the etching gas inlet, and the flow guide surface is configured to guide the gas stream from the etching gas inlet substantially parallel to the substrate, wherein the first flow guide surface and a height between the first flow guide surface and the substrate define an active etching zone with an aspect ratio of a width of the first flow guide surface to the height greater than about 10:1;
    selectively etching to remove the sacrificial material from between the two electrodes with the gas phase etchant; and
    withdrawing at least a portion of the gas stream, contemporaneously with directing the gas stream, through at least one exhaust opening.

19. The method of claim 18, wherein the MEMS device comprises an interferometric modulator.

20. The method of claim 18, wherein directing the gas stream comprises directing the gas stream through a gas curtain nozzle.

21. The method of claim 1, wherein the MEMS device comprises an interferometric modulator.

* * * * *